(12) United States Patent
Kubo et al.

(10) Patent No.: US 6,989,600 B2
(45) Date of Patent: Jan. 24, 2006

(54) INTEGRATED CIRCUIT DEVICE HAVING REDUCED SUBSTRATE SIZE AND A METHOD FOR MANUFACTURING THE SAME

(75) Inventors: Masaharu Kubo, Hachioji (JP); Ichiro Anjo, Koganei (JP); Akira Nagai, Hitachi (JP); Osamu Kubo, Hitachi (JP); Hiromi Abe, Hitachinaka (JP); Hitoshi Akamine, Maebashi (JP)

(73) Assignee: Renesas Technology Corporation, Tokyo (JP)

( * ) Notice: Subject to any disclaimer, the term of this patent is extended or adjusted under 35 U.S.C. 154(b) by 178 days.

(21) Appl. No.: 10/240,651

(22) PCT Filed: Mar. 30, 2001

(86) PCT No.: PCT/JP01/02710

§ 371 (c)(1),
(2), (4) Date: Oct. 3, 2002

(87) PCT Pub. No.: WO01/82367

PCT Pub. Date: Nov. 1, 2001

(65) Prior Publication Data

US 2003/0148558 A1    Aug. 7, 2003

(51) Int. Cl.
*H01L 23/48* (2006.01)

(52) U.S. Cl. ............... 257/758; 257/686; 257/777

(58) Field of Classification Search ........... 257/686, 257/690, 393, 737, 748, 758, 777, 782, 347, 257/724; 361/717, 735, 746, 760, 762, 764, 361/767, 772, 777, 783, 807, 820
See application file for complete search history.

(56) References Cited

U.S. PATENT DOCUMENTS

| | | | | |
|---|---|---|---|---|
| 4,875,617 A | * | 10/1989 | Citowsky | 228/123.1 |
| 5,483,421 A | * | 1/1996 | Gedney et al. | 361/771 |
| 5,640,049 A | * | 6/1997 | Rostoker et al. | 257/758 |
| 6,184,577 B1 | * | 2/2001 | Takemura et al. | 257/701 |
| 6,365,975 B1 | * | 4/2002 | DiStefano et al. | 257/777 |
| 6,410,364 B1 | * | 6/2002 | Hashimoto | 438/118 |
| 6,476,491 B2 | * | 11/2002 | Harada et al. | 257/758 |
| 6,492,681 B2 | * | 12/2002 | Koyama et al. | 257/347 |
| 2003/0001280 A1 | * | 1/2003 | Noguchi et al. | 257/774 |

FOREIGN PATENT DOCUMENTS

| JP | 64-50543 | 8/1987 |
|---|---|---|
| JP | 5-190758 | 1/1992 |

(Continued)

*Primary Examiner*—Allan R. Wilson
(74) *Attorney, Agent, or Firm*—Reed Smith LLP; Stanley P. Fisher, Esq.; Juan Carlos A. Marquez, Esq.

(57) ABSTRACT

CMOS logic LSI comprises, as a part thereof, n-channel MISFET's (Qn), p-channel MISFET's (Qp) and a first-layer wiring (11) to a third-layer (13) formed on a main surface of a silicon substrate (1), and as another part, a fourth-layer wiring (14) to a seventh-layer wiring (17) formed on a main surface of a glass substrate (30) different from the silicon substrate (1). The main surface of the silicon substrate (1) and the main surface of the glass substrate (30) are arranged in face-to-face relation with each other, and a plurality of microbumps (20A) formed at the uppermost portion of the silicon substrate (1) and a plurality of microbumps (20B) formed at the uppermost portion of the glass substrate (30) are electrically connected, thereby constituting the CMOS logic LSI as a whole.

15 Claims, 35 Drawing Sheets

FOREIGN PATENT DOCUMENTS

| | | |
|---|---|---|
| JP | 6-208994 | 1/1993 |
| JP | 8-78622 | 9/1994 |
| JP | 8-186235 | 12/1994 |
| JP | 9-7908 | 6/1995 |
| JP | 10-223636 | 2/1997 |
| WO | WO 01/82367 A1 | 3/2001 |

* cited by examiner

FIG. 4
(a)
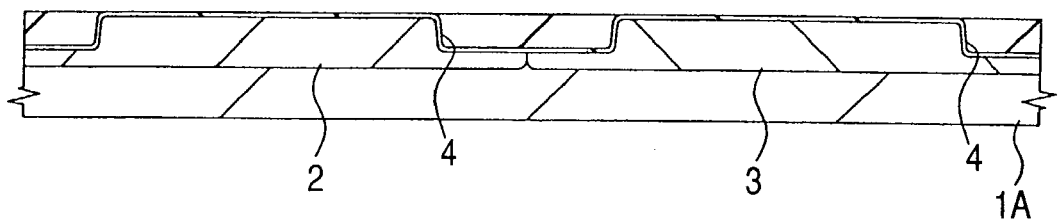
(b)
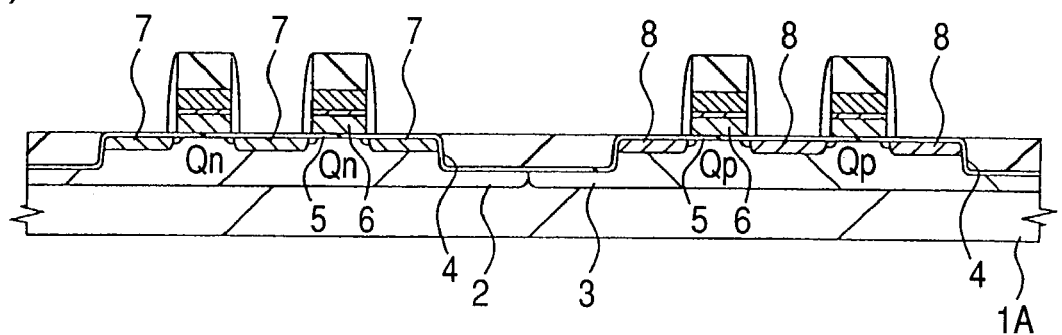
(c)
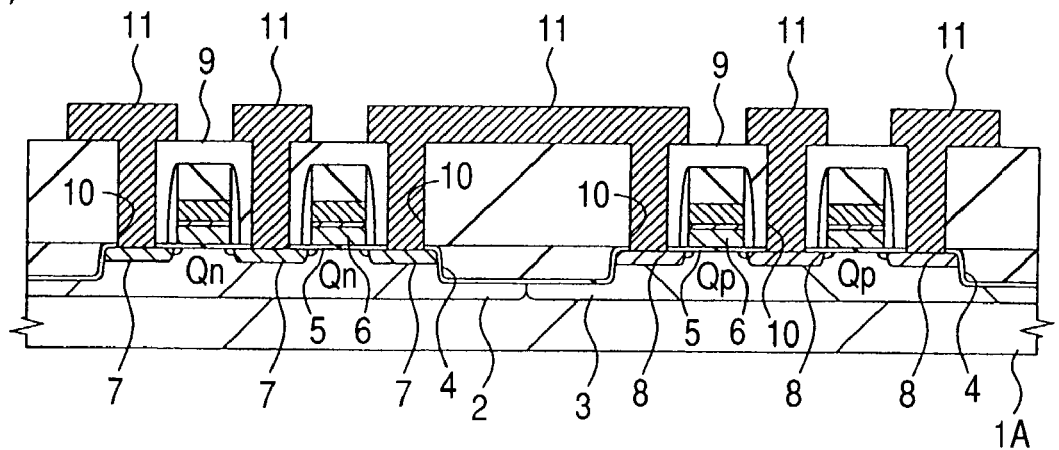

FIG. 5
(a)
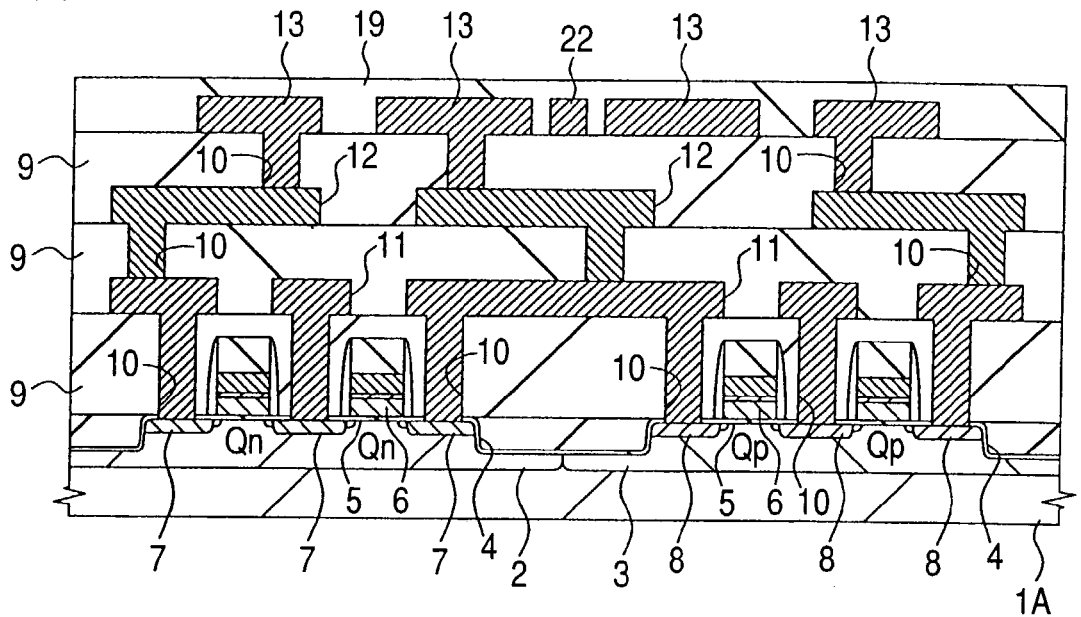
(b)
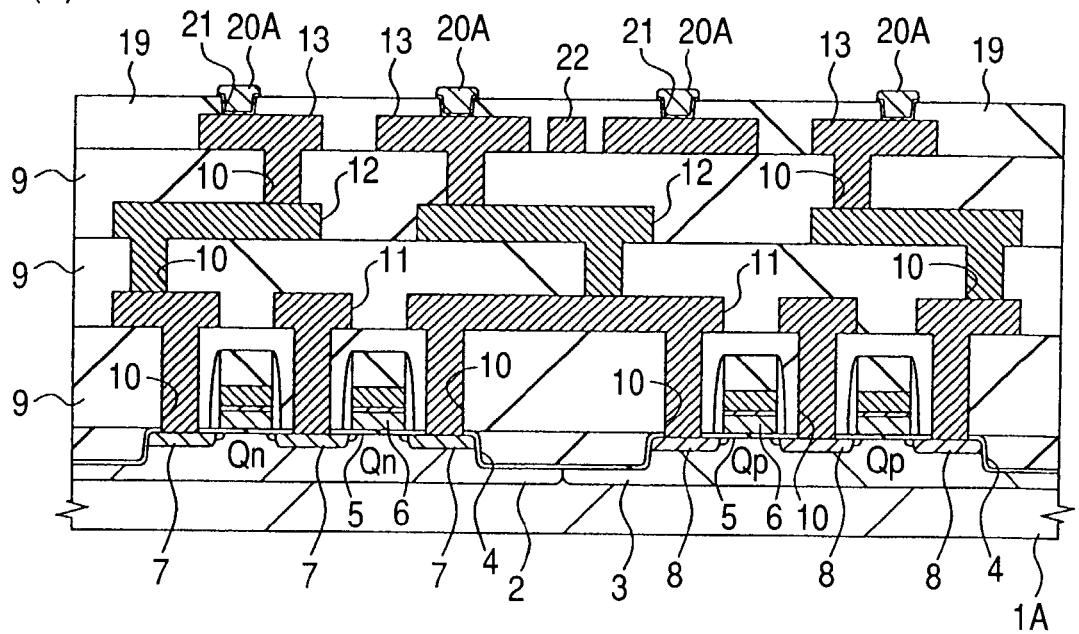

FIG. 6
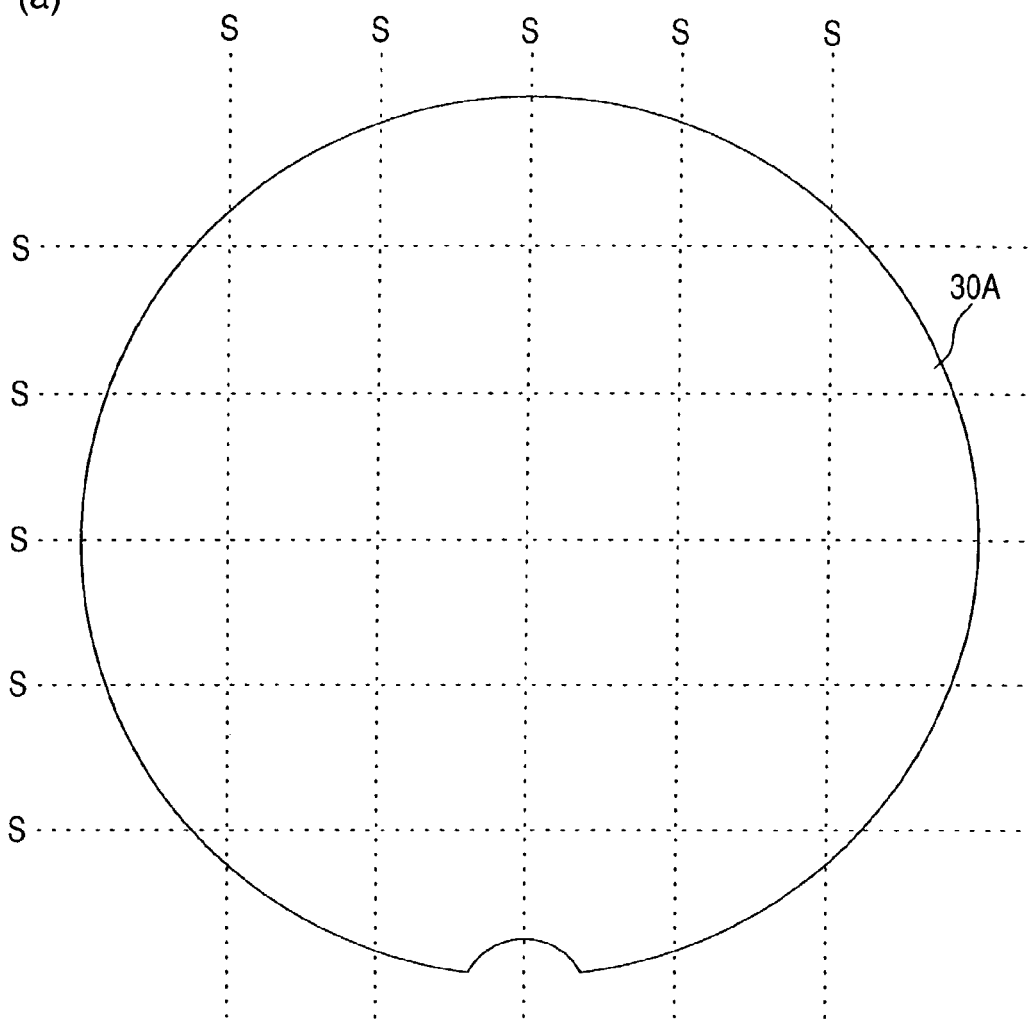
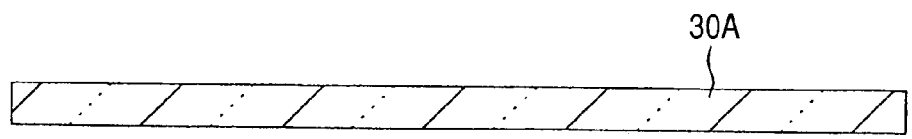

FIG. 9
(a)
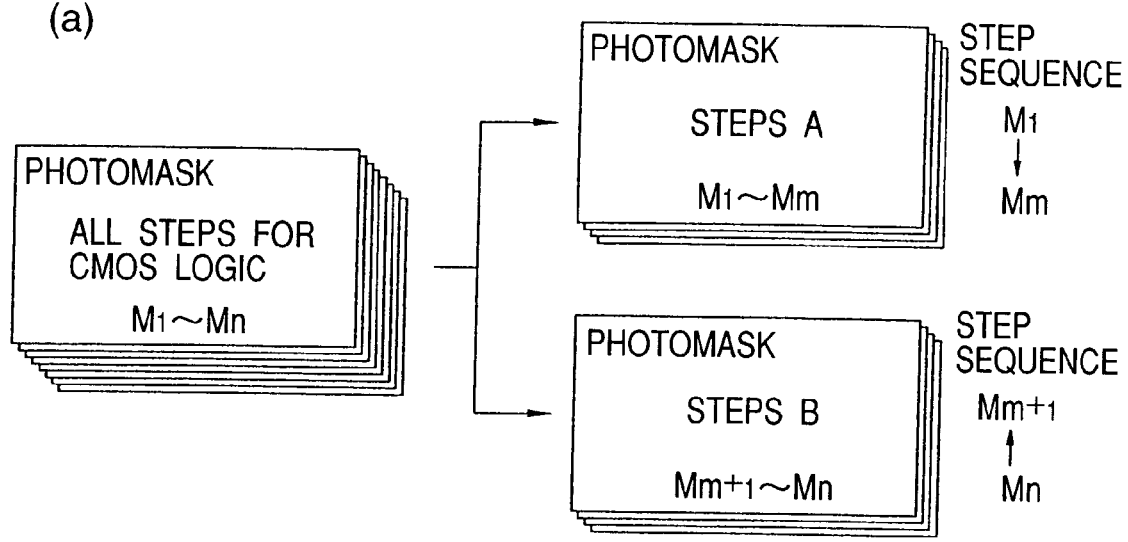
(b)
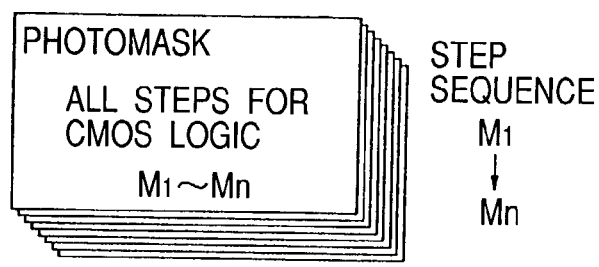

FIG. 17
(a)
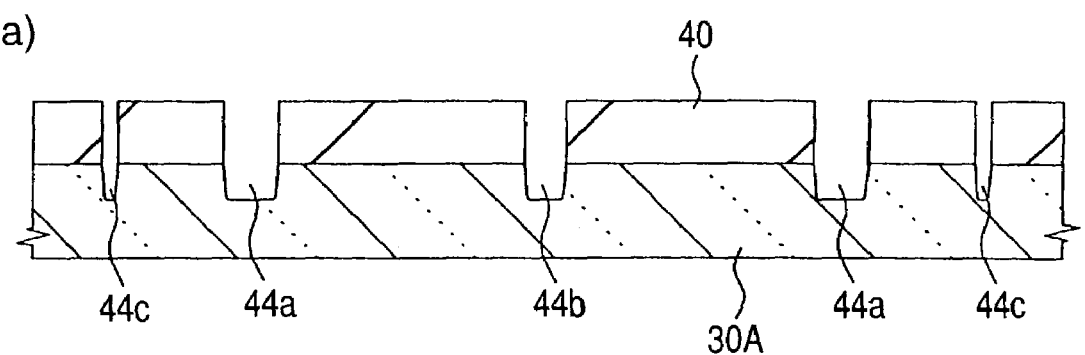
(b)
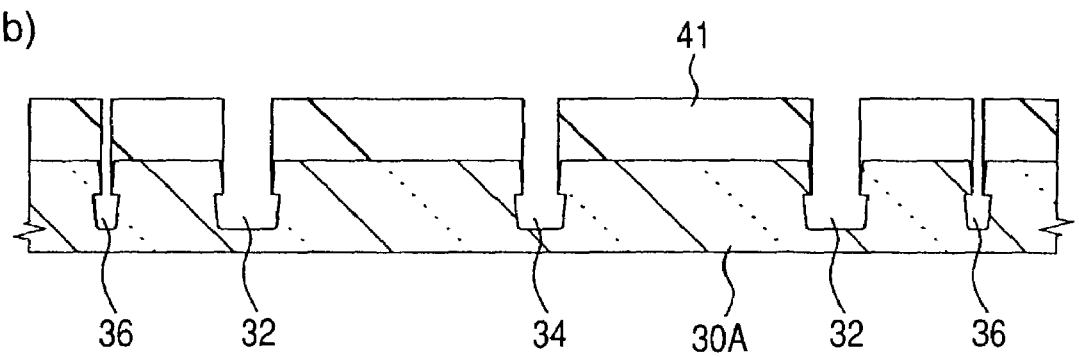

FIG. 18
(a)
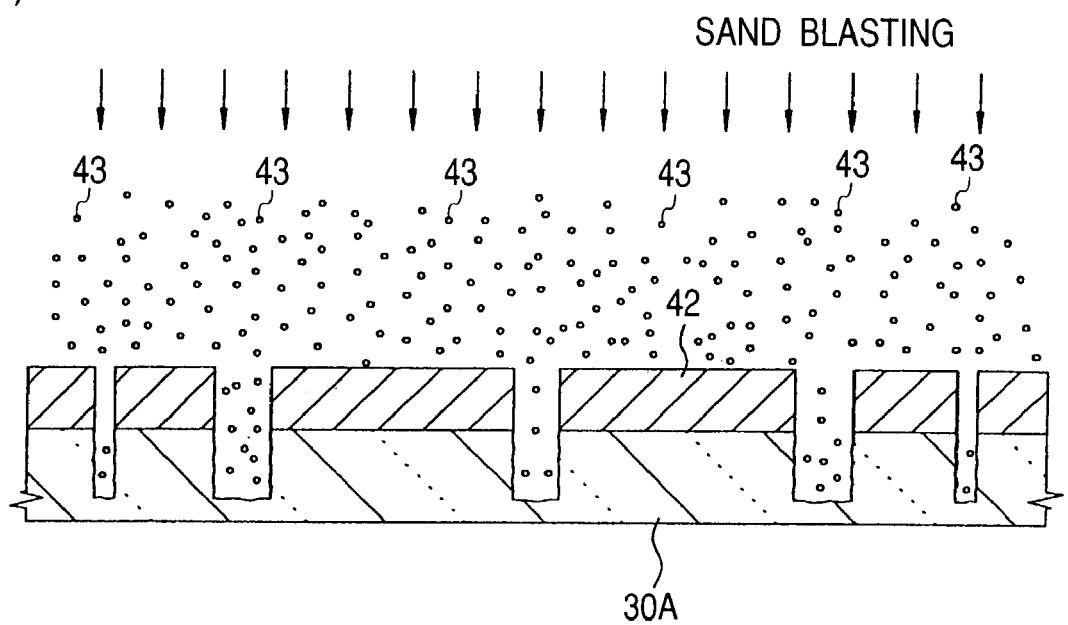
(b)
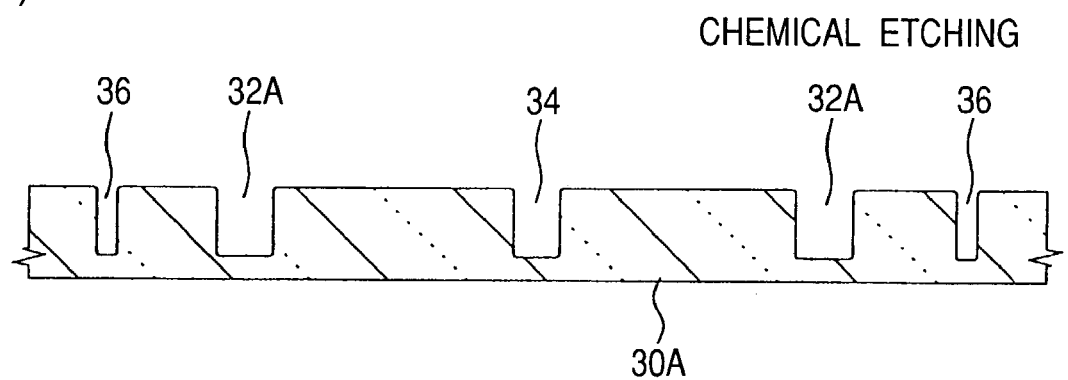

FIG. 27
(a)
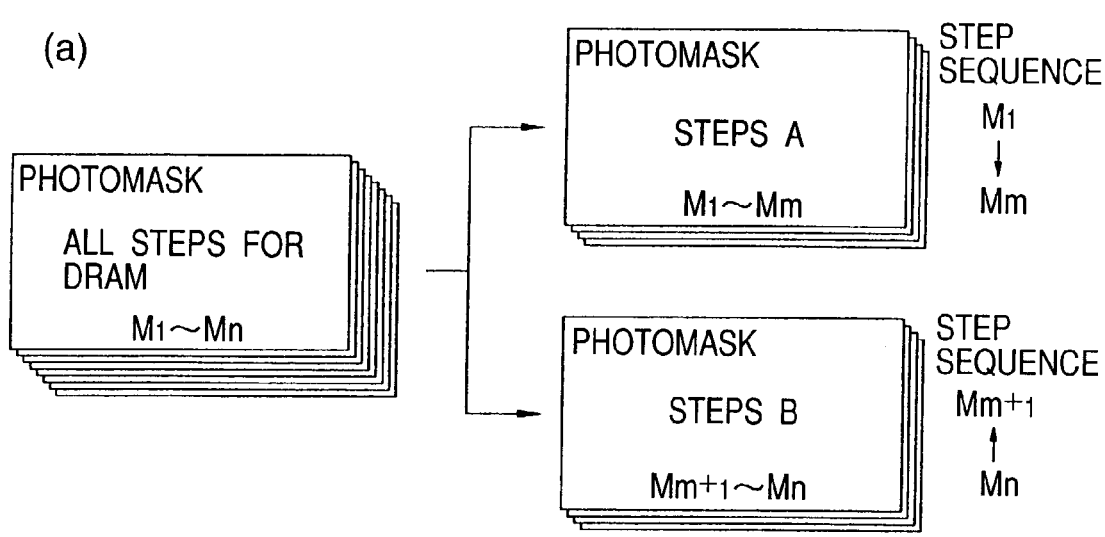
(b)
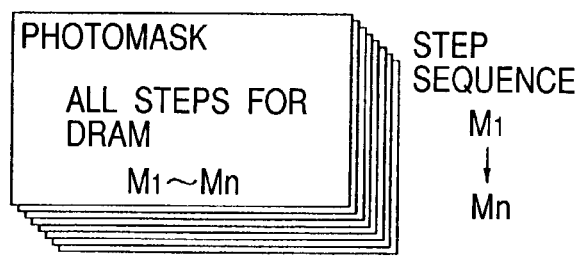

US 6,989,600 B2

INTEGRATED CIRCUIT DEVICE HAVING REDUCED SUBSTRATE SIZE AND A METHOD FOR MANUFACTURING THE SAME

TECHNICAL FIELD

This invention relates to a semiconductor integrated circuit device and also to a manufacturing technique thereof. More particularly, the invention relates to an effective technique for application to a semiconductor integrated circuit device wherein a part of the integrated circuit and other part thereof are, respectively, formed on different substrates.

TECHNICAL BACKGROUND

With LSI, the high degree of integration of circuits and the scale down of chip sizes have been hitherto realized by pursuing the scaling (shrink) depending on the development of photolithography.

In recent years, however, it has become difficult or impossible to further advance the scaling (shrink) at such a speed as experienced hereinbefore owing to the physical limits of elements and also to the limits of lithography. In view of the fact that the surface of a single crystal silicon substrate that is a land on which semiconductor elements are formed has become so valuable that a remarkable tendency is shown to make elements and wirings by building up on the silicon substrate.

In addition, the high degree of integration and the high degree of functioning of LSI have been recently in progress as typically represented by system LSI wherein memory LSI and logic LSI are loaded as mixed. This entails not only the complication of a manufacturing process, but also the ever-increasing number of steps.

DISCLOSURE OF THE INVENTION

However, the complication of a manufacturing process and the increasing number of steps inevitably cause an increasing percent defective, thus permitting the manufacturing yield of products to be lowered. The turn around time (TAT) required for completion of products is prolonged, and products in process line increase in number, with a great risk being involved in view of economy.

In this way, the recent LSI manufacturing process has a difficult problem that cannot be solved through the extension of conventional manufacturing processes. Thus, it is the most important problem to solve how to develop a new process, which can realize an improved manufacturing yield and the shortage of TAT.

An object of the invention is to provide a technique of improving the manufacturing yield of LSI.

Another object of the invention is to provide a technique of shortening the turn around time (TAT) of LSI.

Other object of the invention is to provide a technique of reducing the manufacturing costs of LSI.

These and other objects and novel features of the invention will become apparent from the description of the specification and the accompanying drawings.

Among the inventions disclosed in the present application, typical ones are briefly summarized below.

(1) A semiconductor integrated circuit device of the invention comprises an integrated circuit including a plurality of semiconductor elements and a plurality of wirings, respectively, formed in a plurality of wiring layers, wherein a part of the integrated circuit is formed on a main surface of a first substrate and other part of the integrated circuit is formed on a main surface of a second substrate, in which the first substrate and the second substrate are arranged in face-to-face relation with each other with respect to the main surfaces thereof, and the part and the other part of the integrated circuit are electrically connected to each other through a plurality of first connection terminals formed over the main surface of the first substrate and also through a plurality of second connection terminals formed over the second substrate.

(2) A method of manufacturing a semiconductor integrated circuit according to the invention comprises the steps of:

(a) dividing a plurality of steps of manufacturing an integrated circuit into a first step group and a second step group;

(b) forming a part of the integrated circuit on a main surface of a first substrate, which is realized according to the first step group, and forming other part of the integrated circuit on a main surface of a second substrate, which is realized according to the second step group;

(c) forming a plurality of first connection terminals on the main surface of the first substrate on which the part of the integrated circuit has been formed and forming a plurality of second connection terminals on the main surface of the second substrate on which the other part of the integrated circuit has been formed; and (d) electrically connecting the first substrate having the part of the integrated circuit formed thereon and the second substrate having the other part of the integrated circuit formed thereon via the first connection terminals and the second connection terminals.

BRIEF DESCRIPTION OF THE DRAWINGS

FIGS. 4(a) to 4(c) are, respectively, sectional views of an essential part of a silicon substrate showing a method of manufacturing a semiconductor integrated circuit device according to Embodiment 1 of the invention.

FIGS. 5(a) and 5(b) are, respectively, sectional views of an essential part of a silicon substrate showing a method of manufacturing a semiconductor integrated circuit device according to Embodiment 1 of the invention.

FIG. 6(a) is a plan view of a glass sheet showing a method of manufacturing a semiconductor integrated circuit device according to Embodiment 1 of the invention and FIG. 6(b) is a sectional view thereof.

FIG. 9(a) is a view conceptually showing a method of manufacturing a semiconductor integrated circuit device according to Embodiment 1 of the invention and FIG. 9(b) is a view conceptually showing a conventional manufacturing method.

FIGS. 17(a) and 17(b) are, respectively, sectional views of an essential part of a glass sheet showing a method of manufacturing a semiconductor integrated circuit device according to Embodiment 1 of the invention.

FIGS. 18(a) and 18(b) are, respectively, sectional views of an essential part of a glass sheet showing a method of manufacturing a semiconductor integrated circuit device according to Embodiment 1 of the invention.

FIG. 27(a) is a view conceptually showing a method of manufacturing a semiconductor integrated circuit device according to Embodiment 1 and FIG. 27(b) is a view conceptually showing a conventional method.

FIG. 27 is a plan view showing an example of an input and output circuit of the semiconductor integrated circuit device of Embodiment 5 of the invention.

BEST MODE FOR CARRYING OUT THE INVENTION

Figure 1:
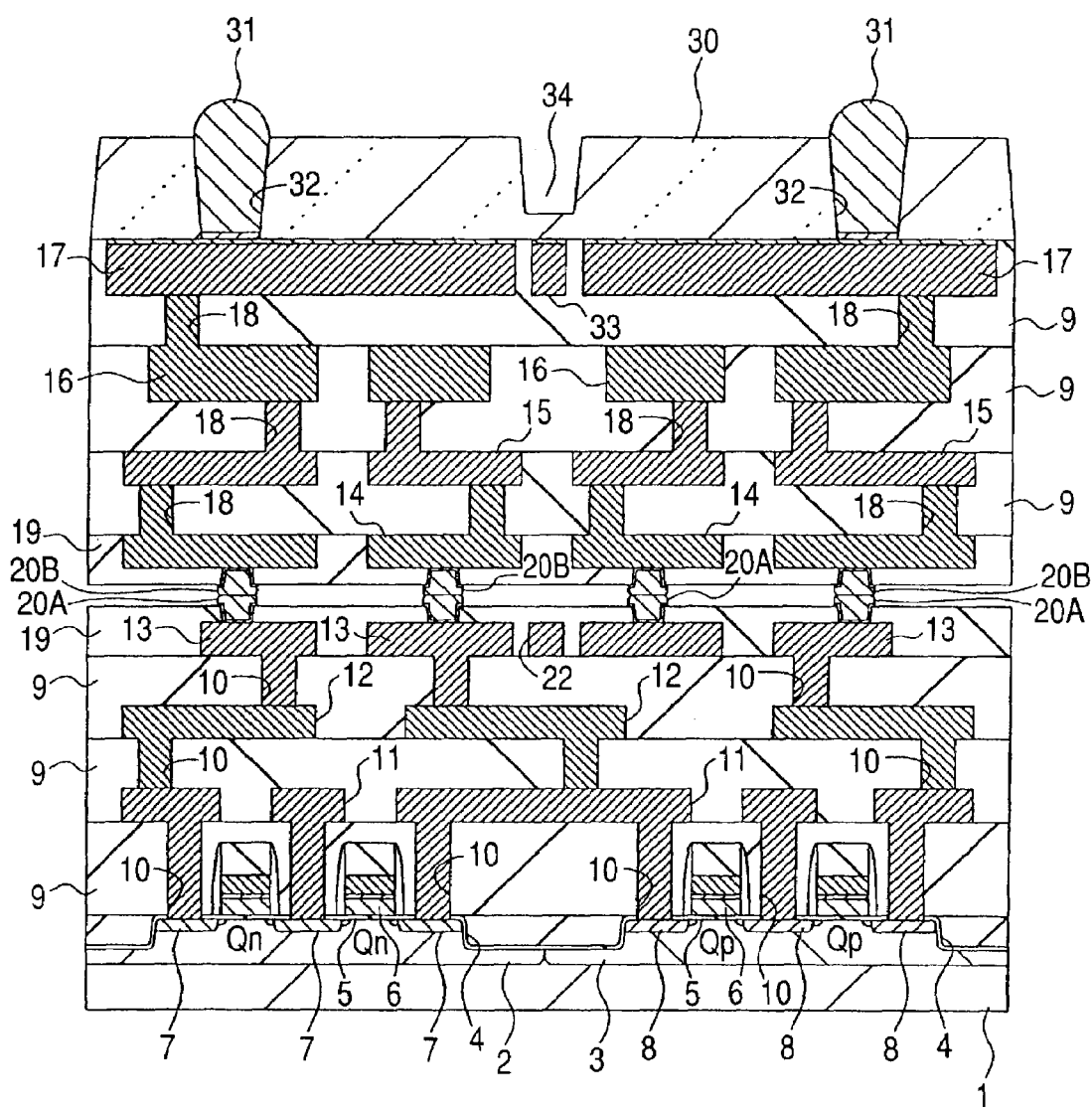
FIG. 1 is a sectional view of an essential part of a semiconductor integrated circuit device according to Embodiment 1 of the invention.

The embodiments of the invention are described in more detail with reference to the accompanying drawings. It will be noted that like members or parts are indicated by like reference numerals throughout the drawings illustrating the embodiments and are not repeatedly explained.

Embodiment 1

A semiconductor integrated circuit device according to this embodiment is a CMOS logic LSI having, for example, seven-layer wirings, and FIG. 1 is a sectional view showing an essential part thereof. It will be noted that although the case where the wiring layers are seven in number is illustrated herein, the number of the wiring layers is not limited to seven.

For instance, a p-type silicon substrate 1 made of single crystal silicon having a specific resistance of about 10 Ω has a p-type well 21 and an n-type well 3 formed on the main surface thereof. An element isolation groove 4 is formed in an element isolation region of the p-type well 2 and the n-type well 3.

A plurality of n-channel MISFET's (metal insulator semiconductor field effect transistor) Qn are formed in the active region of the p-type well 2, and a plurality of p-channel MISFET's Qp are formed in the active region of the n-type well 3. The n-channel MISFET Qn is made mainly of a gate oxide film 5, a gate electrode 6 and n-type semiconductor regions (source, drain) 7, and the p-channel MISFET Qp is made mainly of a gate oxide film 5, a gate electrode 6 and p-type semiconductor regions (source, drain) 8.

A first-layer wiring 11, a second-layer wiring 12, a third-layer wiring 13, a fourth-layer wiring 14, a fifth-layer wiring 15, a sixth-layer wiring 16 and a seventh-layer wiring 17 are, respectively, formed over the n-channel MISFET's Qn and the p-channel MISFET's Qp in the order from the lowermost layer. These seven-layer wirings 11 to 17 are, respectively, constituted, for example, of a metal such as an Al (aluminium) alloy, Cu (copper), W (tungsten) or the like, and the first-layer wiring 11 to the fifth-layer wiring 15 serve mainly as wirings for signal and the sixth-layer wiring and the seventh-layer wiring serve mainly as a wiring for power supply and a ground (GND) wiring, respectively.

Among the seven-layer wirings 11 to 17, the first-layer wiring 11 is electrically connected to the n-channel MISFET Qn or p-channel MISFET Qp via a through-hole 10 formed in an interlayer insulating film 9 made of silicon oxide. The first-layer wiring 11 to the third-layer wiring 13 are mutually, electrically connected with one another via the through-hole 10 formed in the interlayer insulating film 9.

A plurality of microbumps (connection terminals) 20A are formed over an insulating film 19 covering the third-layer wiring 13. These microbumps 20A are each constituted of an Au bump or an Sn bump having, for example, a diameter of approximately 5 to 100 μm and electrically connected to the third-layer wiring 13 through an opening (not shown) formed in the insulating film 19.

The plural microbumps 20A are, respectively, connected with microbumps (connection terminals) 20B each of which is constituted of an Au bump or an Sn bump having likewise a diameter of 5 to 100 μm. These microbumps 20B are electrically connected to the fourth-layer wiring 14 via an opening (not shown) formed in the insulating film 19. More particularly, the third-layer wiring 13 and the fourth-layer wiring 14 are electrically connected with each other through the microbumps 20A and 20B.

The fourth-layer wiring 14 to the seventh-layer wiring 17 are mutually, electrically connected through a though-hole 18 formed in the interlayer insulating film 9. The fourth-layer wiring 14 to the seventh-layer wiring 17 are, respectively, greater than the lower wirings of the first-layer wiring 11 to the third-layer wiring 13 with respect to the width and space thereof. For instance, the width and space of the first-layer wiring 11 to the third-layer wiring 13 are, respectively, at about 0.1 μm to 1 μm, whereas the width and space of the fourth-layer wiring 14 to the seventh-layer wiring 17 are, respectively, at about 1.0 μm to 30 μm. Likewise, the diameter of the through-hole 18 through which the fourth-layer wiring 14 to the seventh-layer wiring 17 are mutually connected is larger than the diameter of the through-hole 10 for connection between the n-channel MISFET Qn (or p-channel MISFET Qp) and the first-layer wiring 11 or that of the through-hole 10 for mutual connection of the first-layer wiring 11 to the third-layer wiring 13.

A glass substrate 30 is placed over the seventh-layer wiring 17 which is the uppermost wiring. A plurality of bump electrodes 31, each serving for an external connection terminal of the CMOS logic LSI, is formed on the upper surface (back surface) of the glass substrate 30. These bump electrodes 31 are each electrically connected to the seventh-layer wiring 17 via a through-hole 32 formed in the glass substrate 30. The bump electrode 31 is made of a solder or the like, which has a melting point lower than the microbumps 20A, 20B electrically connecting the third-layer wiring 13 and the fourth-layer wiring 14, and is larger in size than the microbumps 20A, 20B and has a diameter, for example, of about several hundreds of micrometers. The number of the bump electrodes 31 is smaller than that of the microbumps 20A, 20B electrically connecting the third-layer wiring 13 and the fourth-layer wiring 14 therewith.

Figure 2:
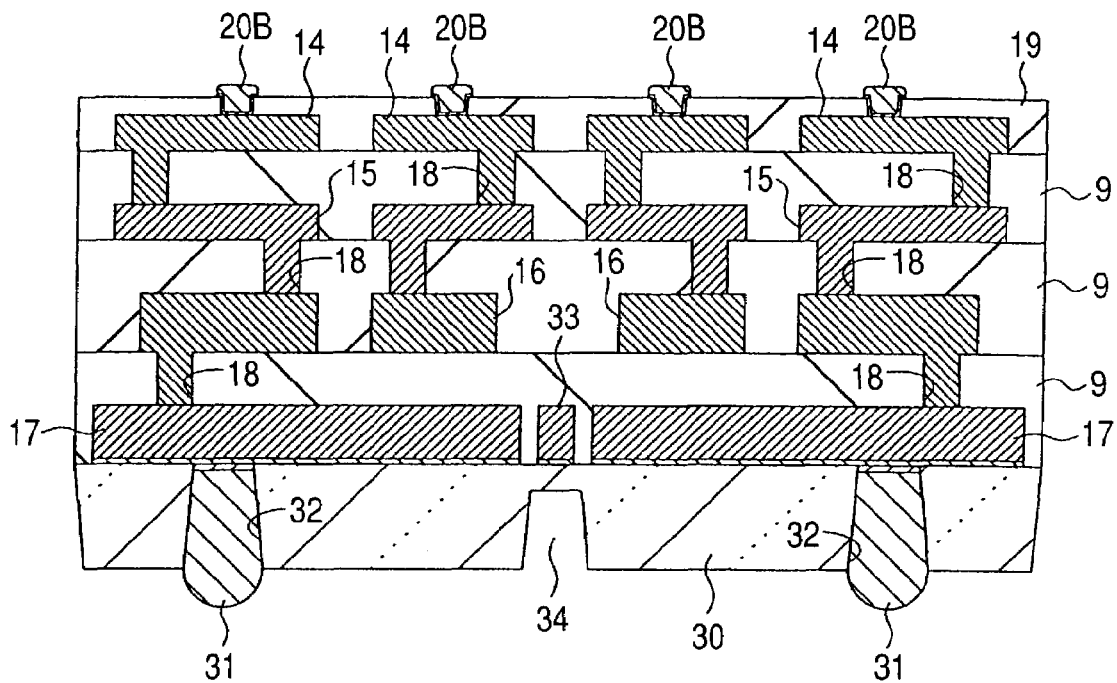
FIG. 2 is a sectional view of an essential part of a silicon substrate showing part of the semiconductor integrated circuit device shown in FIG. 1.
Figure 3:
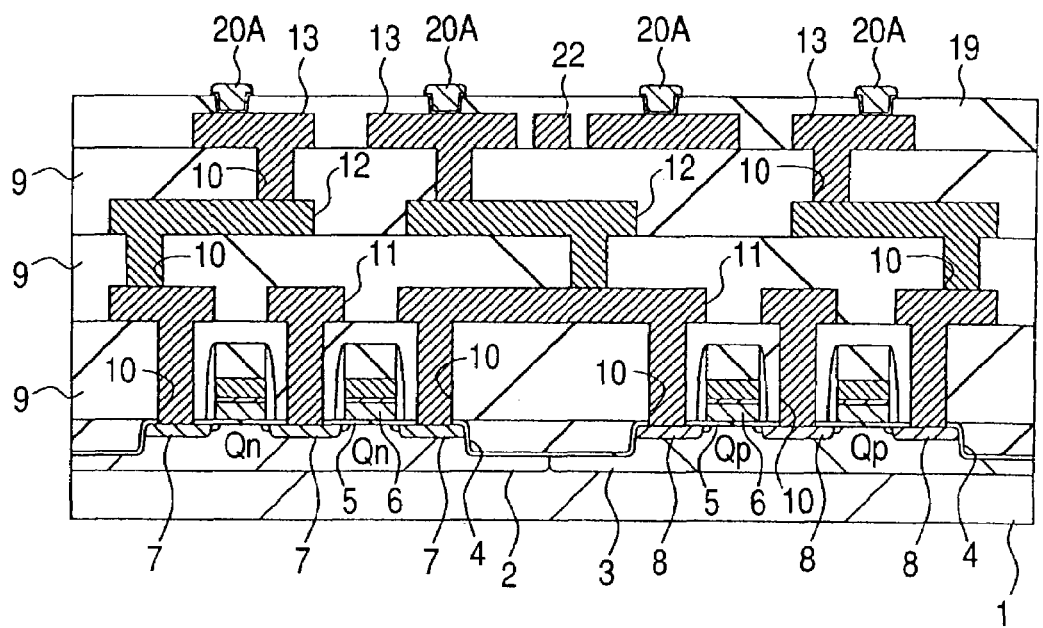
FIG. 3 is a sectional view of an essential part of a silicon substrate showing other part of the semiconductor integrated circuit device shown in FIG. 1.
Figure 7:
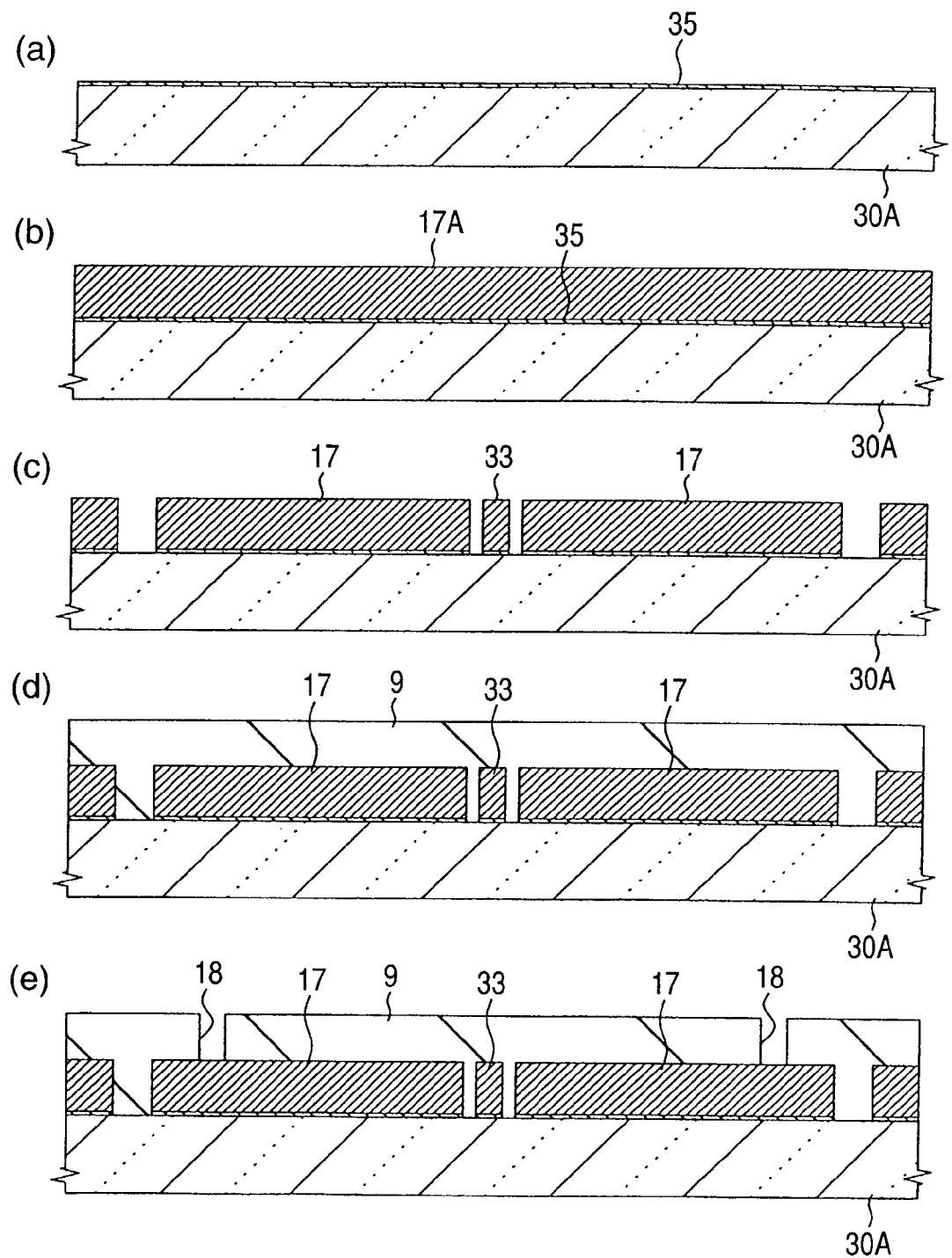
FIGS. 7(a) to 7(c) are, respectively, sectional views of an essential part of a glass sheet showing a method of manufacturing a semiconductor integrated circuit device according to Embodiment 1 of the invention.

FIG. 2 is a sectional view of an essential part showing a portion forming the fourth-layer wiring 14 to the seventh-layer wiring 17 of the CMOS logic LSI that is constituted of the n-channel MISFET's Qn and the p-channel MISFET's Qp and the seven-layer wirings 11 to 17. FIG. 3 is a sectional view of an essential part showing a portion wherein the n-channel MISFET's Qn, the p-channel MISFET's Qp and the first-layer wiring 11 to the third-layer wiring 13.

As shown in FIGS. 2 and 3, the CMOS logic LSI has, as a part thereof, the n-channel MISFET's Qn, the p-channel MISFET's Qp and the first-layer wiring 11 to the third-layer wiring 13 formed on the main surface of the silicon substrate 1 and, as other part thereof, the fourth-layer wiring 14 to the seventh-layer wiring 17 formed on the main surface of the glass substrate 30 that differs from the silicon substrate 1. The plural microbumps 20A formed at the uppermost portion of the silicon substrate 1 and the plural microbumps 20B formed at the uppermost portion of the glass substrate 30 are superposed as shown in FIG. 1 and are mutually, electrically connected with each other, thereby constituting the CMOS logic LSI as a whole.

The positioning of the microbumps 20A formed on the silicon substrate 1 and the microbumps 20B formed on the glass substrate is performed by use of an alignment mark 22 formed at the silicon substrate 1 and an alignment mark 33 formed at the glass substrate 30. The alignment mark 22 of the silicon substrate 1 is made of a wiring material and is formed, for example, simultaneously with the step of forming the third-layer wiring 13. Likewise, the alignment mark 33 of the glass substrate 30 is made of a wiring material and is formed, for example, simultaneously with the step of forming the seventh-layer wiring 17.

In order to permit the two alignment marks 22, 33 to be visually observed at the same time from the back side of the glass substrate 30, no wirings (the fourth-layer wiring 14 to the sixth-layer wiring 16) are formed on the line connecting the alignment mark 22 and the alignment mark 33. Moreover, an opening 34 which permits easy visual observation of the alignment marks 22, 33 is formed at the back side of the glass substrate 30. This opening 34 is formed simultaneously with the formation of the through-hole 32 in the glass substrate 30.

Next, the method of manufacturing the CMOS logic LSI arranged as stated hereinabove is illustrated with reference to FIGS. 4 to 17.

As stated above, the CMOS logic LSI according to this embodiment is so arranged that the silicon substrate 1, in which a part thereof (including the n-channel MISFET's Qn, the p-channel MISFET's Qp and the first-layer wiring 11 to the third-layer wiring 13) is formed, and the glass substrate 30, in which the other part (including the fourth-layer wiring 14 to the seventh-layer wiring 17) is formed, are laid one on another and mutually connected through the microbumps 20A, 20B.

Accordingly, for the manufacture of the CMOS logic LSI of the embodiment, the manufacturing process is divided into two groups, and the first half step of forming the n-channel MISFET's Qn, the p-channel MISFET's Qp and the first-layer wiring 11 to the third-layer wiring 13 and the latter half step of forming the fourth-layer wiring 14 to the seventh-layer wiring 17 are realized while using the silicon substrate 1 and the glass substrate 30, respectively.

The first half step of forming the n-channel MISFET's Qn, the p-channel MISFET's Qp and the first-layer wiring 11 to the third-layer wiring 13 over the silicon substrate 1 can be realized by any known CMOS process.

More particularly, as shown in FIG. 4(a), an element isolation groove 4 is formed in the main surface of the silicon wafer 1A, followed by further formation of a p-type well 2 and an n-type well 3. The element isolation groove 4 is formed by burying an insulating film, such as silicon oxide, in a groove formed by etching of the silicon wafer 1A. The p-type well 2 is formed by ion implantation of P (phosphorus) at a part of the silicon wafer 1A and the n-type well 3 is formed by ion implantation of B (boron) at another part of the silicon wafer 1A.

Next, as shown in FIG. 4(b), the silicon wafer 1A is thermally treated to form a gate oxide film 5 on the surfaces of the p-type well 2 and the n-type well 3, followed by formation of a gate electrode 6 on the respective gate oxide film 5. The gate electrode 6 is constituted, for example, of three layers wherein a P (phosphorus) doped low resistance polysilicon film, a WN (tungsten nitride) film and a W (tungsten) film are built up in this order. Subsequently, P (phosphorus) or As (arsenic) .is ion implanted into the p-type well 2 to form n-type semiconductor regions (source, drain) 7, and B (boron) is ion implanted into the n-type well 3 to form p-type semiconductor regions (source, drain) 8. According to the preceding steps, n-channel MISFET's Qn are formed in the p-type well 2, and a p-channel MISFET's Qp are formed in the n-type well 3, respectively.

Next as shown in FIG. 4(c), an interlayer insulating film 9 is formed over the n-channel MISFET's Qn and the p-channel MISFET's Qp. The interlayer insulating film 9 is subjected to dry etching via a photoresist film mask to form a through-hole 10 over the n-type semiconductor regions (source, drain) 7 and the p-type semiconductor regions (source, drain) 8, followed by formation of a first-layer wiring 11 on the interlayer insulating film 9. The interlayer insulating film 9 is formed, for example, by depositing a silicon oxide film by a CVD method. The first-layer wiring 11 is formed, for example, by depositing a film of a metal such as W, an Al alloy or Cu by a sputtering method on the interlayer insulating film 9 and patterning the metal film by dry etching using a mask of a photoresist film.

Next, as shown in FIG. 5(a), the steps shown in FIG. 4(c) are repeated plural times to successively form a second-layer wiring 12 and a third-layer wiring 13, followed by formation of an insulating film 19 over the third-layer wiring 13. The insulating film 19 is constituted of a silicon oxide film or a silicon nitride film deposited by a CVD method, or a polyimide film deposited by a coating method. It will be noted that the alignment mark 22 is formed simultaneously with the step of forming the third-layer wiring 13.

Next, as shown in FIG. 5(b), the insulating film 19 is dry-etched by use of a photoresist film as a mask to form a plurality of openings (not shown) over the third-layer wiring 13, and a barrier metal layer 21 is formed inside these openings, followed by formation of microbumps 20A on individual barrier metal layers 21. The barrier metal layer 21 is formed, for example, by a Cr film and an Ni film on the insulating film 19 including the inner portions of the openings by a sputtering method and removing unnecessary portions of the Cr film and the Ni film from the insulating film 19 by dry etching using a photoresist as a mask. The microbumps 20A are formed,for example, by depositing an Au film (or Sn film) on the insulating film 18 including the upper portion of the barrier metal layer 21 by a sputtering or plating method and removing unnecessary portions of the Au film (or Sn film) from the insulating film 19 by dry etching using a photoresist film as a mask.

Next, a probe is applied to the microbumps 20A to conduct a test for electric characteristics, after which the silicon wafer 1A is diced into a plurality of silicon substrates (chips) 1, thereby obtaining the silicon substrate 1 shown in FIG. 3.

In this way, according to the manufacturing method of this embodiment, after the formation, on the silicon wafer 1A, of the n-channel MISFET's Qn, the p-channel MISFET's Qp and the first-layer wiring 11 to third-layer wiring 13 or at the stage where substantially half steps of all steps of the CMOS process are carried out on the silicon wafer 1A, a probe is applied to the microbumps 20A to conduct a test for electric characteristics. According to this method, non-defective and defective products can be properly separated from each other at an earlier stage in comparison with a method where a test for electric characteristics is conducted at a stage of completing all the steps of the CMOS process. Accordingly, the manufacturing yield of the CMOS logic LSI can be remarkably improved, thus leading to the reduction of manufacturing costs.

The electric characteristics test is carried out by application of a probe to the microbumps greater in number than external connection terminals, so that a test of higher precision can be performed in comparison with a method where a probe is applied to external connection terminals, such as bonding pads, to conduct the electric characteristics test. Eventually, the area of an embedded test circuit (not shown) formed in the silicon substrate 1 can be significantly reduced or eliminated. This permits the silicon substrate 1 to be reduced in size, which leads to an increasing number of the silicon substrates 1 obtained from the silicon wafer 1A along with an improved production yield, thereby ensuring the reduction of the manufacture costs of the CMOS logic LSI.

The test for electric characteristics, which is carried out by application of a probe to the microbumps 20A, enables one to remarkably shorten the length of a test pattern, thus leading to the shortage in time required for the test and improving the through-put of the testing procedure.

For a method of improving an inspection accuracy of electric characteristics by use of the microbumps 20A, additional microbumps 20A only for the inspection, which are not connected to the microbumps 20B of the glass substrate 30 may be formed at an uppermost portion of the silicon substrate 1. In this case, the number of the microbumps 20A of the silicon substrate 1 becomes larger than that of the microbumps 20B of the glass substrate 30.

On the other hand, the latter half steps of forming the fourth-layer wiring 14 to the seventh-layer wiring 17 in the glass substrate 30 are realized by use of a process line different from the first half steps of forming the semiconductor elements and the lower wirings in the silicon wafer 1A and are carried out simultaneously with the first half steps. In this connection, however, part of a manufacturing apparatus used in the first half steps may be employed in the latter half steps.

In the latter half steps, a glass sheet 30A as shown, for example, in FIGS. 6(a) and 6(b) is used. This glass sheet 30A has rectangular regions marked out with scribe lines S indicated by broken lines, with one region corresponding to one glass substrate 30. This glass sheet 30A is diced along the scribe lines S at a final stage of the manufacturing process described hereinafter for division into a number of glass substrates 30. Although the glass sheet 30A used may be in a rectangular form, the use of a disk like a silicon wafer as shown in FIG. 6(a) permits easy handling in the manufacturing line of a silicon wafer.

The glass sheet 30A is constituted, for example, of no-alkali glass employed for a substrate for TFT liquid crystal (with its composition of $SiO_2/B_2O_3/Al_2O_3/RO$ (alkaline earth metal oxide)=50–60/5–15/10–15/15–25 (wt %), distortion point= 600–700° C. and coefficient of thermal expansion=3.5–5.0 ppm/K), with its thickness being at approximately 0.5 mm.

Because no-alkali glass is small in warpage and dimensional variation, fine wirings, through-holes, microbumps and the like can be formed in high dimensional accuracy on the main surface of the glass sheet 30A by a lithographic technique. No-alkali glass is more inexpensive than silicon, so that the manufacturing costs of the CMOS logic LSI can be reduced over the case where the fourth-layer wiring 14 to the seventh-layer wiring 17 are formed in a silicon wafer. In general, glass is more excellent in insulating characteristics than silicon, with the advantage of no eddy current loss.

For the material of the glass sheet 30A, borosilicate glass that is ordinarily used as a transparent glass portion such as of a semiconductor sensor may be used as well as the above-mentioned no-alkali glass. The borosilicate glass contains several percent of alkali components (e.g. less than 0.1 wt % for no-alkali glass). In this sense, care should be taken for its use with respect to the influences of the element on electric characteristics. Nevertheless, this glass is so small in warpage and dimensional variation as no-alkali glass, and is thus suited for the formation of a fine pattern using a photolithographic technique. The cost of borosilicate glass is approximately at ⅓ to ⅕ of that of no-alkali glass, thus leading to further reduction of the manufacturing costs of the CMOS logic LSI.

For glass materials which are small in warpage and dimensional variation and are free of alkali components, silica glass may also be used, but is inconveniently more expensive that no-alkali glass. It will be noted that although soda glass is further more inexpensive than borosilicate glass, it has a higher content of alkali components, with the apprehension that the electric characteristics of the resulting element may undesirably vary. Moreover, a silicon wafer may be used in place of glass, this inconveniently invites higher manufacturing costs than the case where glass is used.

It should be noted that because alkali components present in glass are liable to separate out at the surface of the glass, an alkali concentration at the surface of the glass substrate 30 tends to increase with time. To cope with this, a barrier method of alkali components is effective, in which a silicon nitride film is coated on the surface of the glass sheet 30A by a CVD method.

For the formation of the fourth-layer wiring 14 to the seventh-layer wiring 17 by use of the glass sheet 30A, as shown in FIG. 7(a), a bonding layer 35 is formed on the main surface of the glass sheet 30A in order to increase the bonding force between the glass and a wiring material. The bonding layer 35 is constituted, for example, of a TiN (titanium nitride) film or a TiW (titanium tungsten) film deposited by a sputtering method.

Next, as shown in FIG. 7(b), after deposition of an Al alloy film 17A over the bonding layer 35 by a sputtering method, the Al alloy film is subjected to patterning by dry etching using a photoresist film as a mask as shown in FIG. 7(c) to form the seventh-layer wiring 17 and an alignment mark 33.

As shown in FIG. 7(d), an interlayer insulation film 9 is formed over the seventh-layer wiring 17, after which as shown in FIG. 7(e), the interlayer insulating film 9 is dry etched using a photoresist film as a mask to form a through-hole 18 over the seventh-layer wiring 17. The interlayer insulating film 9 is constituted of a silicon oxide film deposited by a CVD method or a polyimide film deposited by a coating method.

Figure 8:
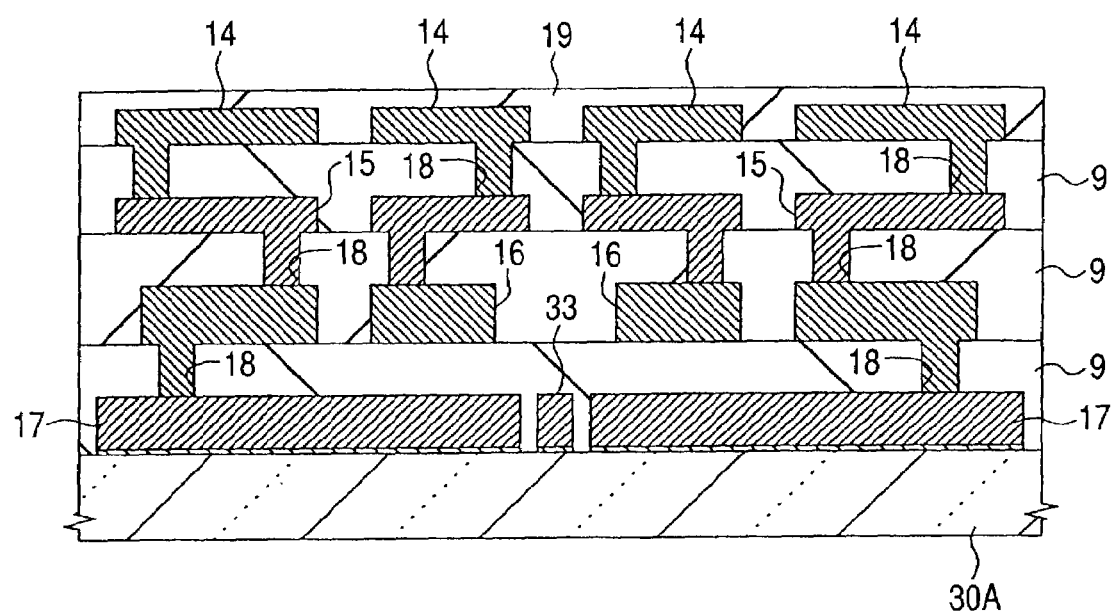
FIG. 8 is a sectional view of an essential part of a glass sheet showing a method of manufacturing a semiconductor integrated circuit device according to Embodiment 1 of the invention.

Next, as shown in FIG. 8, the steps of FIGS. 7(b) to 7(e) are repeated plural times to successively form the sixth-layer wiring 16, the fifth-layer wiring 15 and the fourth-layer wiring 14, after which an insulating film 19 is formed over the fourth-layer wiring 14. The insulating film 19 is constituted of a silicon oxide film or a silicon nitride film deposited by a CVD method, or a polyimide film deposited by a coating method.

The width of the seventh-layer wiring 17 to the fourth-layer wiring 14 and the space between adjacent wirings formed over the glass sheet 30A are, respectively, those of the first-layer wiring 11 to the third-layer wiring 13 formed over the silicon wafer 1A as stated hereinbefore. Likewise, the diameter of the through-hole 18 formed in the glass sheet 30A is larger than the diameter of the through-hole 10 formed in the silicon wafer 1A.

In this way, according to the manufacturing method of this embodiment, fine wirings having a small width (i.e. the first-layer wiring 11 to the third-layer wiring 13) and the through-hole 10 having a small diameter are formed at the silicon wafer 1A, and the wirings having a large width (i.e. the fourth-layer wiring 14 to the seventh-layer wiring 17) and the through-hole 18 having a large diameter are formed at the glass sheet 30A. This permits the silicon substrate 1 to be made small in size, so that the number of the silicon substrates 1 obtained from the silicon wafer 1A increases with an improved yield, thus leading to the reduction of the manufacturing costs of the CMOS logic LSI.

In the manufacturing method of the embodiment, the fourth-layer wiring 14 to the seventh-layer wiring 17 are formed in reverse order from a conventional process. More particularly, according to the conventional CMOS process, a first-layer wiring 11 to a third-layer wiring 13 are successively formed over n-channel MISFET's Qn and p-channel MISFET's Qp, after which a fourth-layer wiring 14, a fifth-layer wiring 15, a sixth-layer wiring 16 and a seventh-layer wiring 17 are formed over the third-layer wiring 13 in this order. In contrast, according to the manufacturing method of this embodiment, the seventh-layer wiring serving 17 as an uppermost-layer wiring is formed on the glass sheet 30A, followed by successive formation of the sixth-layer wiring 16, the fifth-layer wiring 15 and the fourth-layer wiring 14 thereover.

FIG. 9(a) is a view conceptually showing such a manufacturing method of the embodiment, and FIG. 9(b) is a view conceptually showing a manufacturing method conventionally carried out. In these figures, one step is expressed in terms of one photomask and plural consecutive steps are expressed by plural photomasks laid one on another.

According to the manufacturing method of the embodiment, all steps of a wafer process are divided into first half steps A ($M_0$ to $M_m$) and latter half steps B ($M_{m+1}$ to $M_n$). The first half steps A ($M_0$ to $M_m$) are realized on a first substrate (silicon wafer 1A herein) in an ordinary order ($M_0 \rightarrow M_m$), and the latter half steps B ($M_{m+1}$ to $M_n$) are realized on a second substrate (glass substrate 30A herein) in an order ($M_n \rightarrow M_{m+1}$) reverse to the ordinary order. Where circuit patterns of photomasks are, respectively, transferred to the second substrate in the latter half steps B ($M_{m+1}$ to $M_n$), the photomasks used should be ones wherein a pattern of a photomask used to realize the latter half steps B ($M_{m+1}$ to $M_n$) in the ordinary order is reversed by 180°.

Thereafter, a test of electric characteristics is carried out at the final stage of the steps A ($M_0 \rightarrow M_m$) to extract a non-defective first substrate and a test of electric characteristics is carried likewise carried out at the final stage of the steps B ($M_n \rightarrow M_{m+1}$) to extract a non-defective second substrate 2. Subsequently, the non-defective first substrate and the non-defective second substrate are electrically connected via connection terminals (i.e. the microbumps 20A, 20B) to obtain LSI through all the steps ($M_0$ to $M_n$) of the wafer process.

According to such a manufacturing process as set out above, the first half steps A ($M_0 \rightarrow M_m$) and the latter half steps B ($M_n \rightarrow M_{m+1}$) can be simultaneously carried out in parallel to each other, so that the turn around time (TAT) required for the completion of a product can be shortened to substantially a half in maximum in comparison with the case where the steps ($M_0$ to $M_n$) are realized on a single substrate.

Since the first half steps A ($M_0$ to $M_m$) and the latter half steps B ($M_n$ to $M_{m+1}$) are carried out while using the first substrate and the second substrate, respectively, the number of the steps performed on the respective substrates become substantially half the case where a single substrate used for all the steps A ($M_0$ to $M_m$). This permits a percent defective, which cumulatively increases with an increasing number of steps, to be drastically reduced, thereby significantly improving the manufacturing yield of products.

When design rules of the first half steps A ($M_0$ to $M_m$) and the latter half steps B ($M_n$ to $M_{m+1}$) differ from each other, for example, a fine pattern is formed in the first substrate in the half steps A ($M_0$ to $M_m$) and a wide pattern is formed in the second substrate in the latter half steps B ($M_n$ to $M_{m+1}$). In doing so, manufacturing apparatuses of one to several generations ago, which have never been used in the first half steps A ($M_0$ to $M_m$) for fine patterns, can be reused for the latter half steps B ($M_n$ to $M_{m+1}$) wherein a wide pattern is formed. This results in the reduction of costs and depreciation costs of manufacturing facilities, which are shifted onto unit article, thus leading to the reduction of the manufacturing cost of a product.

Moreover, according to the manufacturing method of this embodiment, some (e.g. the first-layer wiring 11 to the third-layer wiring 13) of the seven-layer wirings 11 to 17 are formed on the silicon substrate 1, and the others are formed on the glass substrate 40, so that the number of the wiring layers formed on the respective substrates 1, 30 becomes about half the case where the seven-layer wirings 11 to 17 are formed on a single substrate. This would mitigate a step difference of an underlying layer that cumulatively increases with an increasing number of wiring layers, thus improving the yield in wiring-forming steps and the reliability of connection between wirings. As a result, such a complicated, costly wiring-forming process as a so-called Damascene process becomes unnecessary, in which a wiring material is buried inside the groove formed in an interlayer insulating film, after which an unnecessary wiring material is removed from the interlayer insulating film by a CMP (chemical mechanical polishing) method to form a buried wiring.

Figure 10:
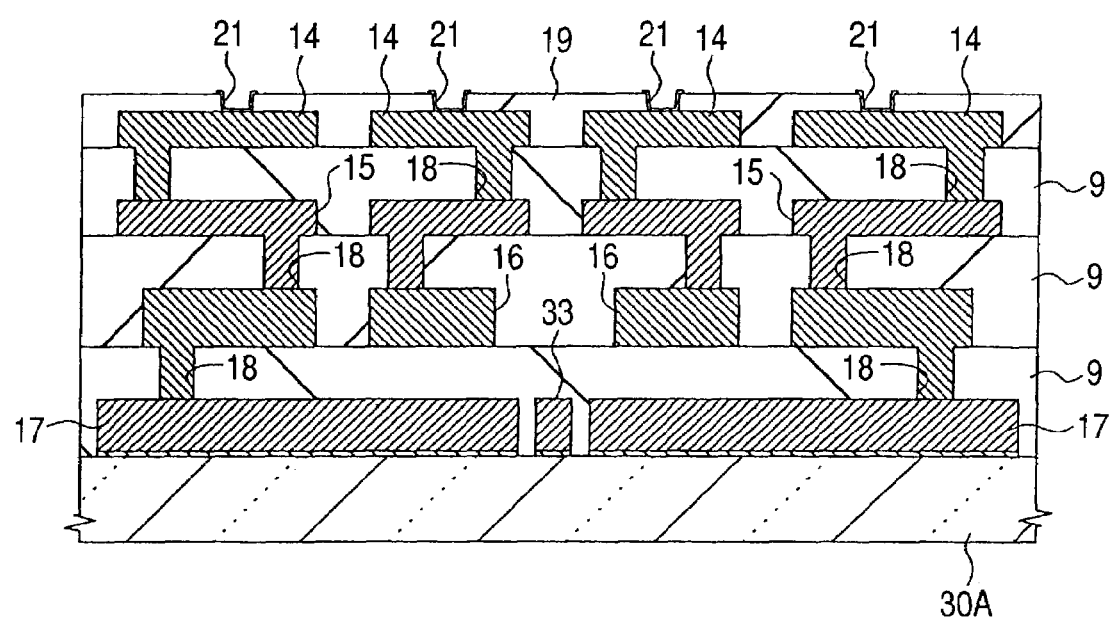
FIG. 10 is a sectional view showing an essential part of a glass sheet showing a method of manufacturing a semiconductor integrated circuit device according to Embodiment 1 of the invention.

Next, as shown in FIG. 10, the insulating film 19 is dry etched by use of a photoresist film mask to form openings (not shown) over the fourth-layer wiring 14, followed by formation of a barrier metal layer 21 inside each opening. The barrier metal layer 21 is formed, for example, by depositing a Cr film and then an Ni film on the insulating film including the inner portions of the openings by a vacuum deposition method or a sputtering method, followed by removal of unnecessary portions of the Cr film and the Ni film from the insulating film by dry etching using a photoresist film as a mask.

Figure 11:
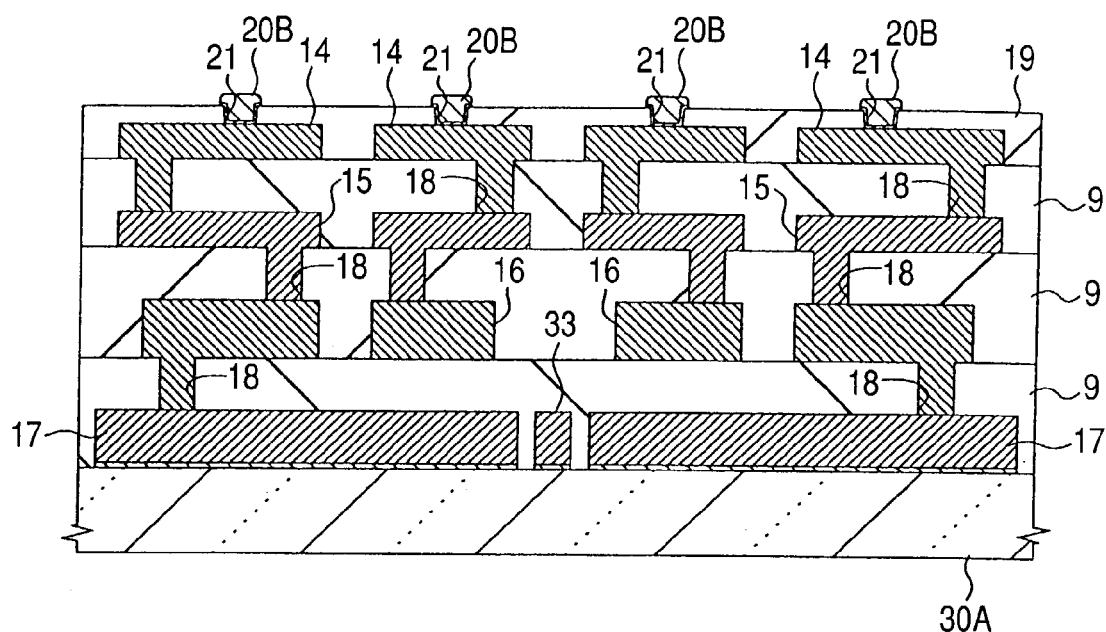
FIG. 11 is a sectional view showing an essential part of a glass sheet showing a method of manufacturing a semiconductor integrated circuit device according to Embodiment 1 of the invention.

Next, as shown in FIG. 11, microbumps 20B are formed on the respective barrier metal layers 21. The microbumps 20B is formed, for example, by depositing an Au film (or an Sn film) on the insulating film 19 including the upper portion of the barrier metal 21 by a vacuum deposition method, sputtering method or plating method and removing unnecessary portions of the Au film (or the Sn film) from the insulating film 19 by dry etching using a photoresist film as a mask.

The wirings (i.e. the fourth-layer wiring 14 to the seventh-layer wiring 17) on the glass sheet 30A may be constituted of a W film deposited by a spurring method or a Cu film formed by plating. Where a CU film formed by plating is used as a wiring material, a bonding layer 35 formed between the glass sheet 30A and the seventh-layer wiring 17 should be made, for example, of a TiN (titanium nitride) film or a Cr film deposited by a sputtering method. In addition, an upper-layer wiring and a lower-layer wiring may be constituted of different types of metal materials, respectively.

According to the preceding steps set out hereinabove, the fourth-layer wiring 14 to the seventh-layer wiring 17 and the microbumps 20B are formed over the glass sheet 30A, respectively. Subsequently, the glass sheet is processed at the back side thereof according to the following procedure to form bump electrodes 31 serving as external connection terminals of the CMOS logic LSI.

Figure 12:
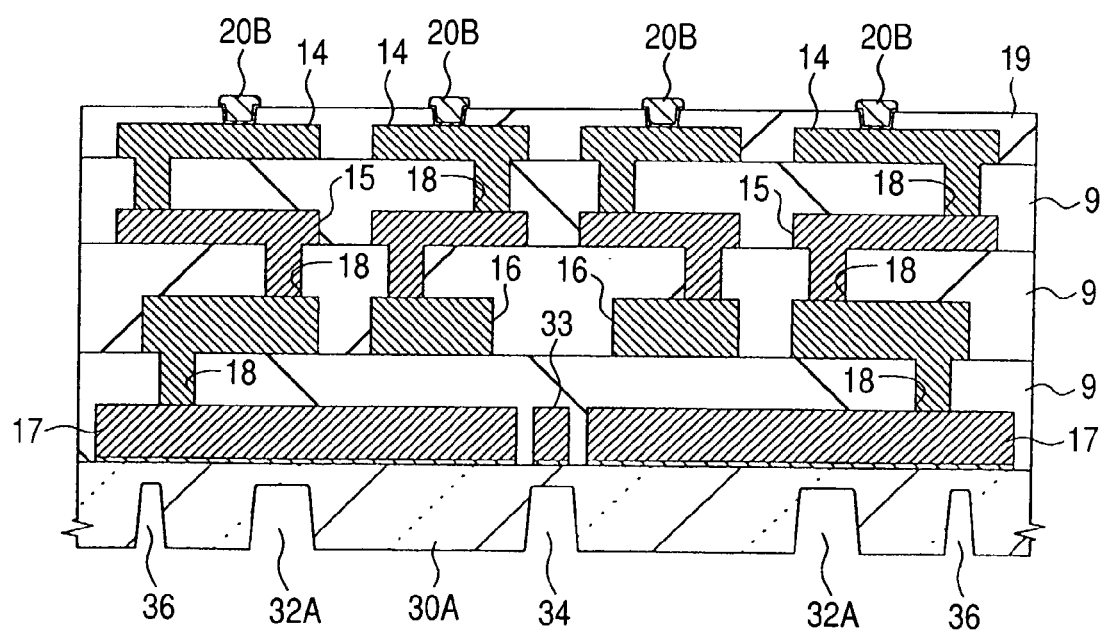
FIG. 12 is a sectional view showing an essential part of a glass sheet showing a method of manufacturing a semiconductor integrated circuit device according to Embodiment 1 of the invention.

Initially, as shown in FIG. 12, the glass sheet 30A is wet etched to an extent of half the thickness thereof at the back side (lower side) thereof by use of an etchant containing hydrofluoric acid, followed by formation of openings 32 at regions which are to be connected with bump electrodes 31 in a subsequent step. Simultaneously, an opening 34 is formed in the glass sheet 30A beneath the alignment mark 33, and scratch guides 36 are each formed at the scribe region of the glass sheet 30A.

For the wet etching of the glass sheet 30A at the back side thereof, the glass sheet 30A is covered with a photoresist film or the like at the back side thereof except the regions where the openings 32A, 34 and the scribe guides 36 are to be formed. It is preferred that the main surface side of the glass sheet 30A over which the microbumps 20B and the wirings (i.e. the fourth-layer wiring 14 to the seventh-layer wiring 17) are formed should be covered with a resist film, a cover lay film or a UV film capable of being separable upon irradiation of UV light.

Figure 13:
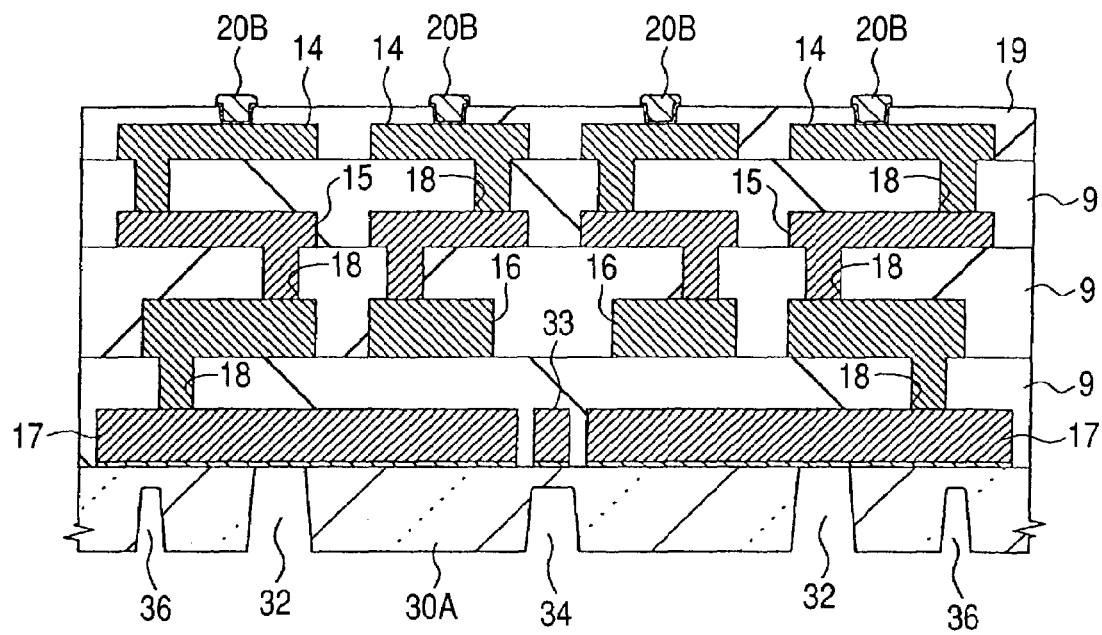
FIG. 13 a sectional view showing an essential part of a glass sheet showing a method of manufacturing a semiconductor integrated circuit device according to Embodiment 1 of the invention.

Thereafter, as shown in FIG. 13, the glass sheet 30A at the inside of the opening 32 is further wet etched to form a through-hole 32 reaching the seventh-layer wiring 17. For the wet etching, the glass sheet 30A is covered with a photoresist at the back side thereof except the regions where the through-holes 32 are to be formed. Likewise, the main surface side of the glass sheet 30A is also covered with a resist film, a cover lay film, a UV film or the like.

Figure 14:
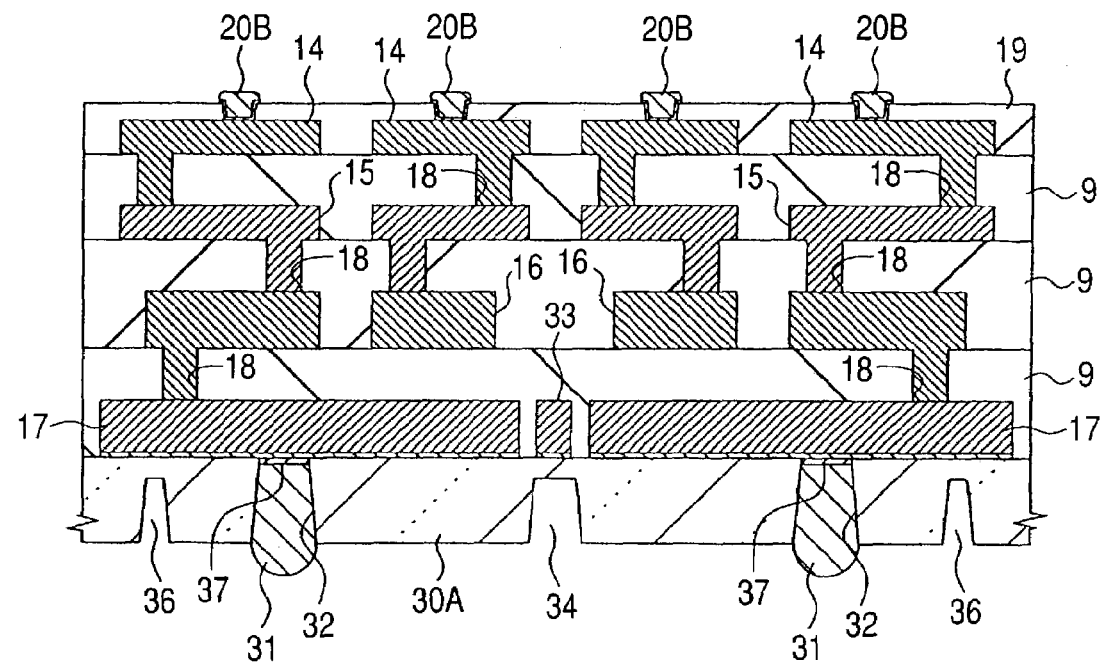
FIG. 14 is a sectional view showing an essential part of a glass sheet showing a method of manufacturing a semiconductor integrated circuit device according to Embodiment 1 of the invention.

Next, as shown FIG. 14, a barrier metal layer 37 is formed at the bottom of the through-hole 32, followed by formation of a bump electrode 31 inside the through-hole 32. The barrier metal layer 37 is formed, for example, by depositing a Cr film, an Ni film and an Au film on the back side of the glass sheet 30A including the inner portions of the through-holes 32 by a vacuum deposition method or a sputtering method, followed by removing the unnecessary portions of the Cr film, Ni film and Au film by dry etching or wet etching using a photoresist film as a mask. The barrier metal layer 37 may be formed so as to wholly cover the inner walls of the through-hole 32.

The bump electrode 31 is formed of an eutectic solder (Pb37/Sn63: 183° C.) having a melting point lower than the microbumps 20A, 20B, or a low melting solder (Sn17/Bi57/In26: 78.9° C.), and is formed by reflowing a solder melt fed into the through-hole 32 by a solder ball feeding method or a screen printing method. The bump electrode 31 may be not only in a ball form, but also in a land form.

Next, a probe is applied to the microbumps 20B to conduct a test for electric characteristics, after which the glass sheet 30A is diced along scribe lines S (see FIG. 6) for division into a plurality of glass substrates 30, thereby obtaining a glass substrate 30 as shown in FIG. 2.

Figure 15:
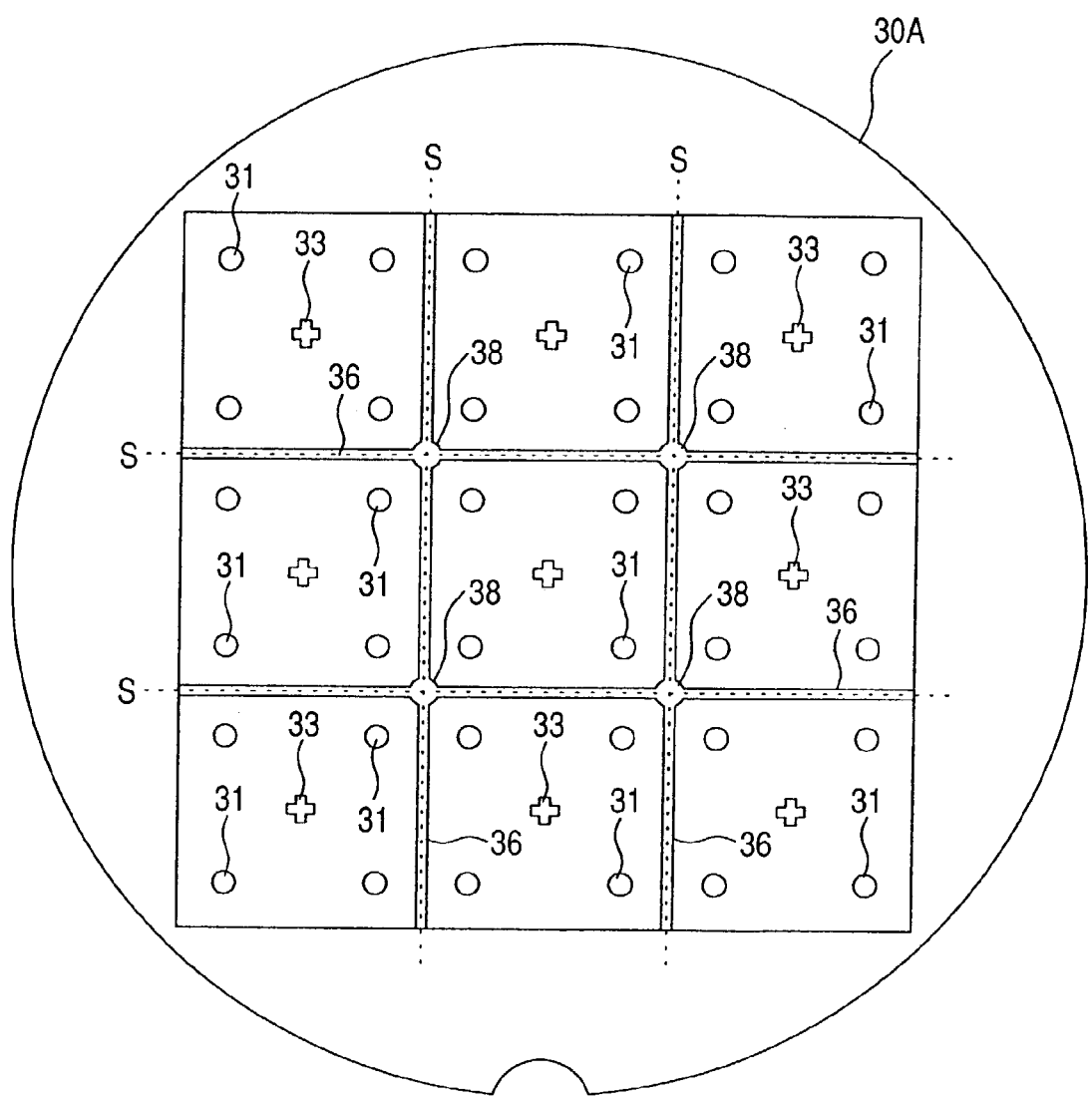
FIG. 15 is a plan view of a glass sheet showing a method of manufacturing a semiconductor integrated circuit device according to Embodiment 1 of the invention.

In the dicing step of the glass sheet 30A, such scribe guides 36 as mentioned before are formed with respect to the scribe lines S of the glass sheet 30A, permitting the dicing to proceed easily and suppressing the glass sheet 30A from suffering breakage and burr. Moreover, as shown in FIG. 15, for example, when a round hole 38 with a diameter larger than the scribe guide 36 is formed at the intersection of the scribe lines S in the glass sheet 30A, it becomes possible to effect the dicing in an easier manner. This round hole 38 is formed simultaneously with the step of forming the scribe guides 36 by wet etching.

Figure 16:
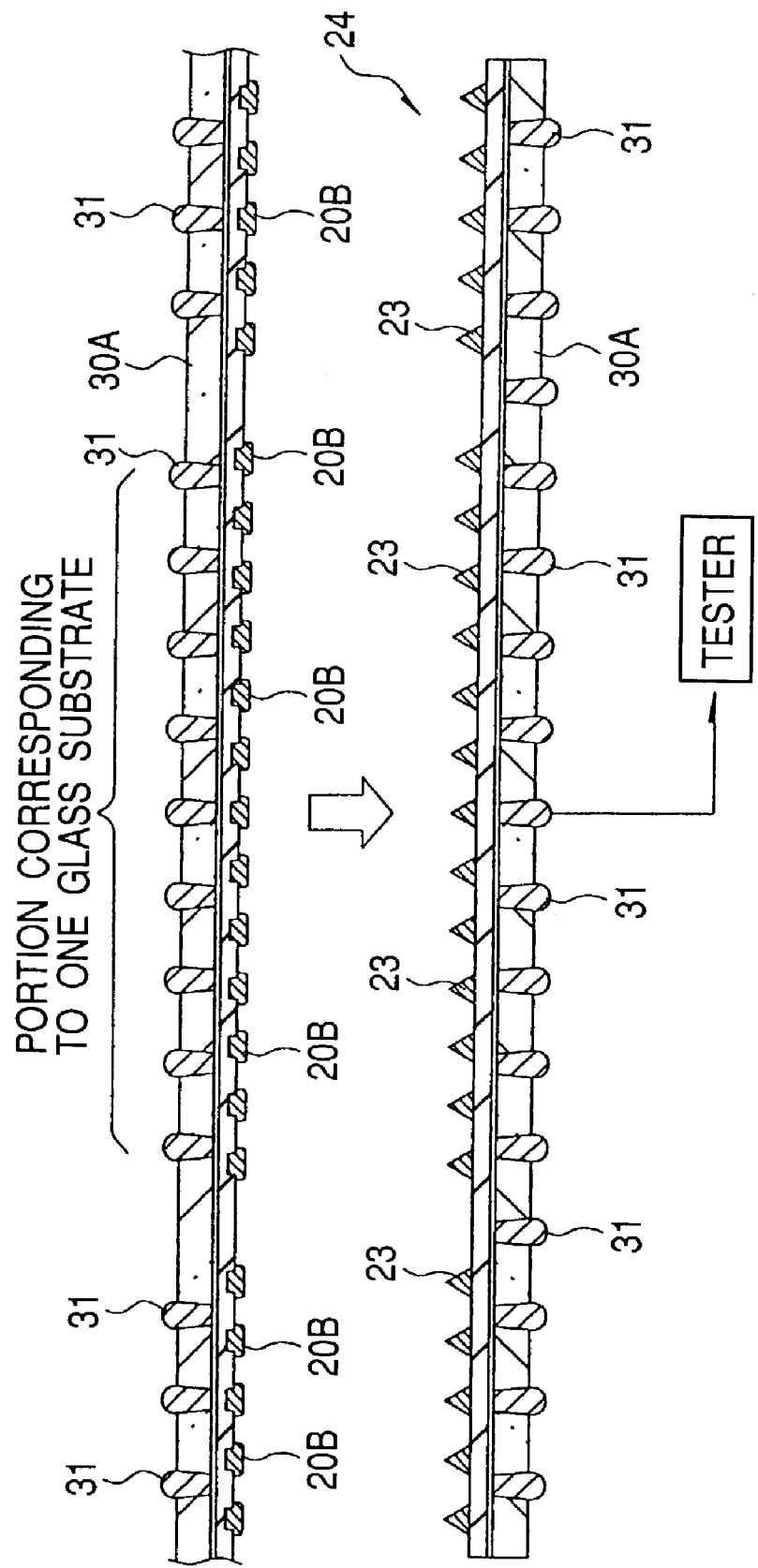
FIG. 16 is a sectional view showing an essential part of a glass sheet showing a method of manufacturing a semiconductor integrated circuit device according to Embodiment 1 of the invention.
Figure 19:
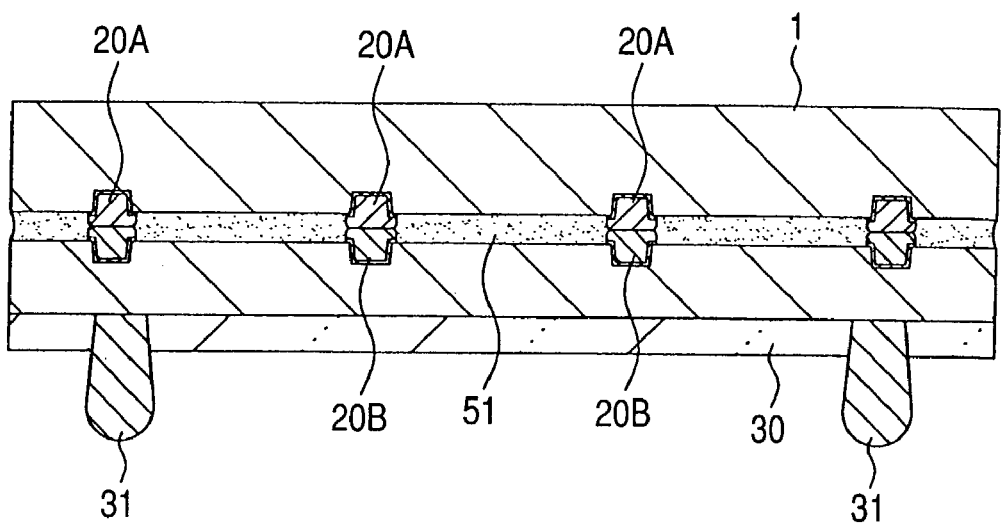
FIG. 19 is a sectional view showing the state where the semiconductor integrated circuit device of Embodiment 1 of the invention is sealed in a package.

For carrying out the electric characteristics test by application of a probe to the microbumps 20B, it is possible to use a prober 24 wherein projected contacts 23, each made of a probe circuit (not shown) and a hard metal such as Ni, are formed on the main surface of the glass sheet 30 and bump electrodes 31 connected to a tester are formed at the back side thereon as is particularly shown in FIG. 16, for example. This prober 24 can be used upon testing of electric characteristics of the silicon wafer 1A.

In the step of forming the openings 32A, 34 and the scribe guides 22 by wet etching the back surface of the glass sheet 30A (see FIG. 12), wet etching may be performed in twice. In this case, as shown in FIG. 17(*a*), by wet etching using a photoresist film 40 as a mask, shallow grooves 44*a*, 44*b*, 44*c* are formed in the glass sheet 30A. Subsequently, as shown in FIG. 17(*b*), the glass sheet 30A at the bottoms of the grooves 44*a*, 44*b*, 44*c* is further wet etched using a second photoresist film 41, as a mask, covering the side walls of the grooves 44*a*, 44*b*, 44*c* to form openings 32A, 34 and scribe guides 36.

According to the above method, although the steps increase in number, the second wet etching is carried out in a condition where the grooves 44*a*, 44*b*, 44*c* are covered with the photoresist 41 at side walls thereof, so that the degree of side etching of the glass at the insides of the openings 32A, 34 and the scribe guides 36 is reduced. This ensures that the through-hole 32, the opening 34 and the scribe guides 36 can be formed in a fine measurement with high accuracy.

The processing of the back side of the glass sheet 30A may be performed using a combination of dry etching and wet etching. In this case, shallow grooves are formed in the glass sheet 30A by drying etching using a photoresist film as a mask, followed by further etching of the glass sheet 30A by wet etching using the above photoresist film as a mask. According to this method, after the shallow grooves have been formed by dry etching, which is lower in throughput than wet etching but with higher anisotropy, using a photoresist film as mask, the glass inside the grooves is wet etched. This allows the through-hole 32, the opening 34 and the scribe guides 36 to be formed in a fine measurement with high accuracy, and the lowering of through-put is only slight.

The glass sheet 30A can be processed at the back side thereof by use of a laser. For a laser beam source, a carbon dioxide laser having a beam source whose wavelength (in the vicinity of 10.6 µm) is at a level of being absorbed with glass is used.

The back side processing of the glass sheet 30A may be performed by a sand blasting method where an abrasive such as alumina is blown against the glass substrate under high pressure. As shown in FIG. 18(*a*), this method comprises covering part of the back side of the glass sheet 30A with a metal mask 42, and blowing an abrasive 43, such as alumina, against the glass sheet 30A of regions not covered with the metal mask 42 under high pressure to form the openings 32A, 34 and the scribe guides 36. Nevertheless, the processing only with the sand blasting method makes rough surfaces of the glass sheet 30A, so that the back side of the glass sheet 30A is further subjected to chemical etching with an etchant such as hydrofluoric acid, a hydrofluoric acid/nitric acid mixed solution, an alkali or the like. This permits the openings 32A, 34 and the scribe guides 36 to be formed as having smooth inner wall surfaces.

The processing of the main surface of the glass sheet 30A (i.e. the formation of the fourth-layer wiring 14 to the seventh-layer wiring 17 and the microbumps 20B) and the processing of the back surface (i.e. the formation of the through-hole 32, the opening 15 and the scribe guide 22 and the connection of the bump electrodes 31) may be performed in the order different from the above-stated one. For instance, it is possible to form the through-hole 32, the opening 34 and the scribe guides 36 in the back surface of the glass sheet 30A, and subsequently form the fourth-layer wiring 14 to the seventh-layer wiring 17 and the microbumps 20B on the main surface of the glass sheet 30A, followed by connection of the bump electrode 31 to the through-hole 32A. Alternatively, it may also be possible to form the fourth-layer wiring 14 to the seventh-layer wiring 17 and the microbumps 20B on the main surface of the glass sheet 30A and further form the through-hole 32 by etching of the opening 32A, followed by connection of the bump electrode 31 to the through-hole 32.

The wafer process of the CMOS logic LSI of this embodiment is completed by superposing the silicon substrate 1 and the glass substrate 30, each manufactured by such a method as stated hereinbefore, in such a way that the main surfaces thereof are in face-to-face relation with each other for connection between the microbumps 20A, 20B to electrically connect the circuits formed at the silicon substrate 1 (including the n-channel MISFET's Qn, the p-channel MISFET's Qp and the first-layer wiring 11 to the third-layer wiring 13) to the circuits formed at the glass substrate 30 (the fourth-layer wiring 14 to the seventh-layer wiring 17).

The microbumps 20A of the silicon substrate 1 and the microbumps 20B of the glass substrate 30 are mutually connected through Au/Sn eutectic (Au80/Sn20: 280° C. or Au10/Sn90: 217° C.) bonding or through thermocompression bonding with Au/Au (450 to 550° C.).

Alternatively, Au/Si eutectic (Au98/Si2: 370° C.) bonding, Au/Ge eutectic (Au88/Ge12: 356° C.) bonding, high temperature solder (Pb97.5/Ag2.5: 304° C.) reflowing, Pb-free solder (Sn96/Ag3.5/Cu0.5: 260° C.) reflowing, W plug/In pool (melting point of In: 156.6° C.) burying methods may be used for the connection.

Furthermore, the surface activation bonding method may be used, which makes use of such a nature of a metal or metals that when metal pieces, each having a clean surface, are made close to each other in high vacuum, they bond together at normal temperatures. In this case, mention is made of combinations of such metal materials including Al—Al, Al—Si, Cu—Sn, Si—GaAs, Si—InP, GaAs—InP and the like.

The CMOS logic LSI manufactured in such a way as stated hereinabove is provided as a final product by sealing the silicon substrate 1 and the glass substrate 20 with a package. The manner of sealing may take various forms using existing packages.

For instance, FIG. 18 shows an example wherein in order to improve the connection reliability of the microbumps 20A, 20B, a sealing resin (underfill resin) 51 is filled in the space between the main surface of the silicon substrate 1 and the glass substrate 30.

Figure 20:
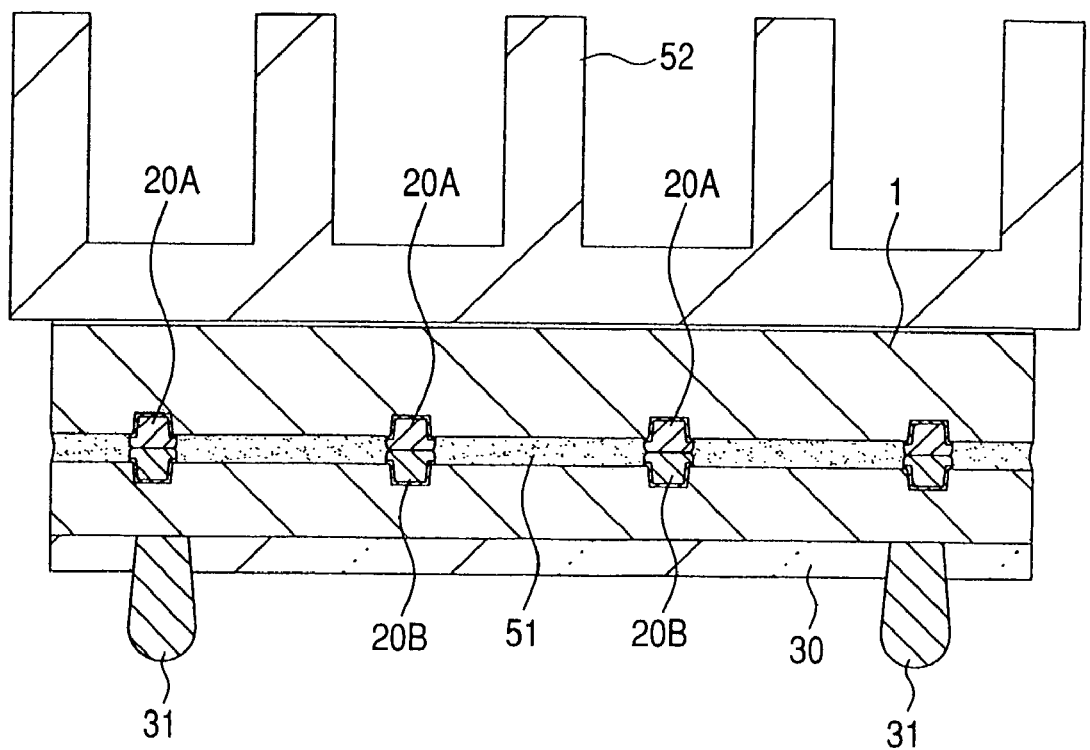
FIG. 20 is a sectional view showing the state where the semiconductor integrated circuit device of Embodiment 1 of the invention is sealed in a package.

As shown in FIG. 20, when a radiation fin 52 is attached to the silicon substrate 1 at the back side (upper side) thereof, a heat resistance can be reduced. The CMOS logic LSI of the embodiment can utilize the bump electrodes 31 formed in the glass substrate 20 as a thermal via, so that part of heat generated in the silicon substrate 1 can be released to outside from the back side of the glass substrate 30 through the bump electrodes 31.

Embodiment 2

Figure 21:
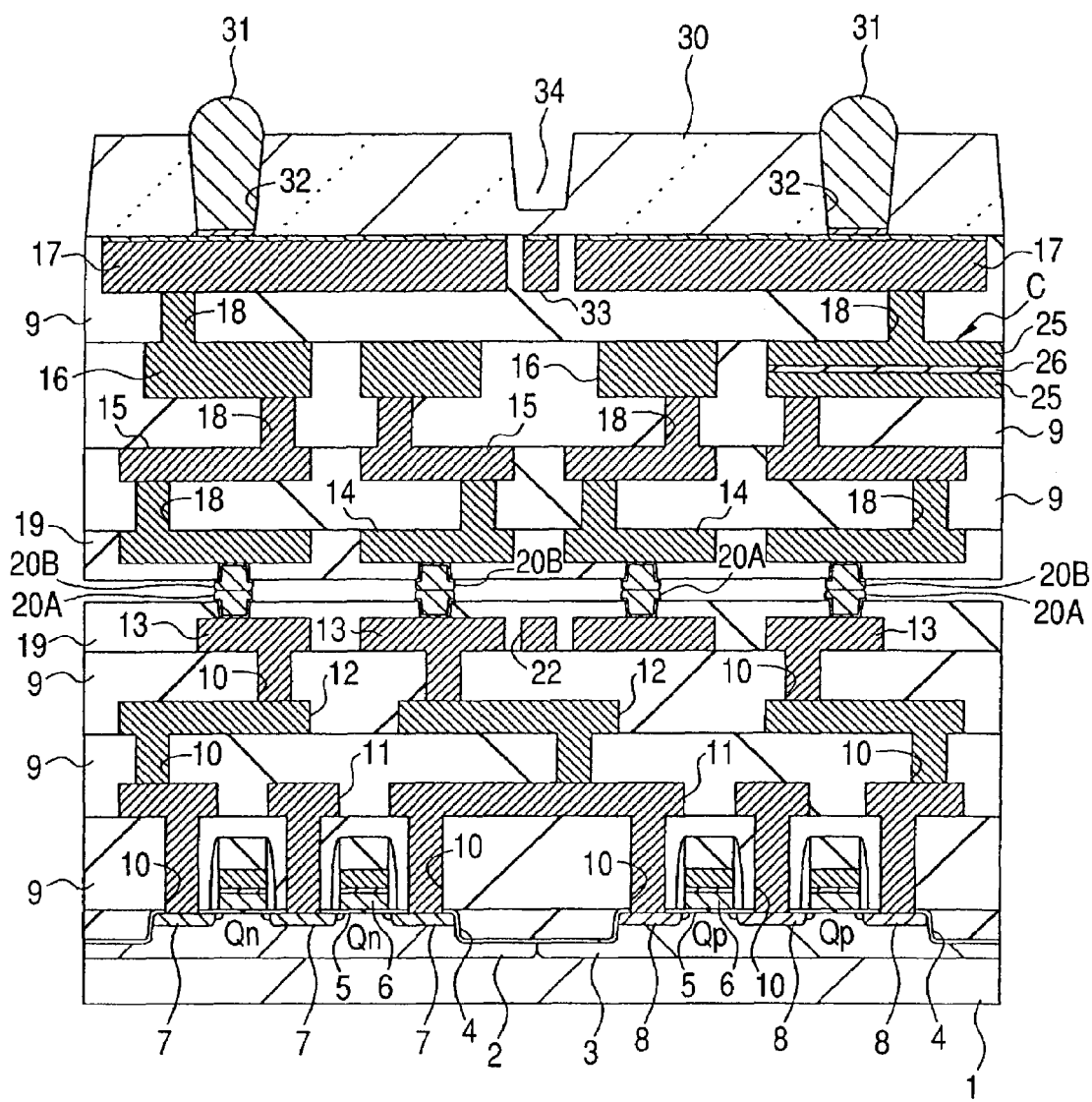
FIG. 21 is a sectional view of an essential part showing a semiconductor integrated circuit device according to Embodiment 2 of the invention.

FIG. 21 is a sectional view showing a CMOS logic LSI of this embodiment. As shown in the figure, this CMOS logic LSI includes a capacitor (C) formed on the main surface of the glass substrate 30 for the purpose of improving working characteristics and noise control characteristics. Electrodes 25 for the capacitor (C) are formed of a wiring material, such as an Al alloy film, deposited by a sputtering method, and a capacitive insulating film 26 is formed by use of a $Ta_2O_5$ (tantalum oxide) film or the like deposited by a CVD method or an anodization method. Although not shown in the figure, passive components other than the capacitor (C), such as an inductance (L) and a resistor (R), are formed, thereby enabling one to further improve the working characteristics and noise control characteristics. The inductance (L) is formed by use of a wiring material such as an Al alloy film, deposited by a sputtering method, and a resistor (R) is formed by use of a polysilicon film deposited by a CVD method.

The passive components, such as the capacitor (C), inductance (L) and resistor (R) and the like, should preferably be formed at the side of the glass substrate 30. More particularly, when the fine wirings (i.e. the first-layer wiring 11 to the third-layer wiring 13) and the though-hole 10 having a small diameter are, respectively, formed at the side of the silicon substrate 1, and the passive components of large areas are formed at the side of the glass substrate 30, the silicon substrate 1 can be reduced in size.

It will be noted that glass is more liable to charge than silicon. Especially, when the passive components (L, C, R) are formed at the glass substrate 30, a measure for preventing the components from electrostatic discharge damage becomes necessary.

Figure 22:
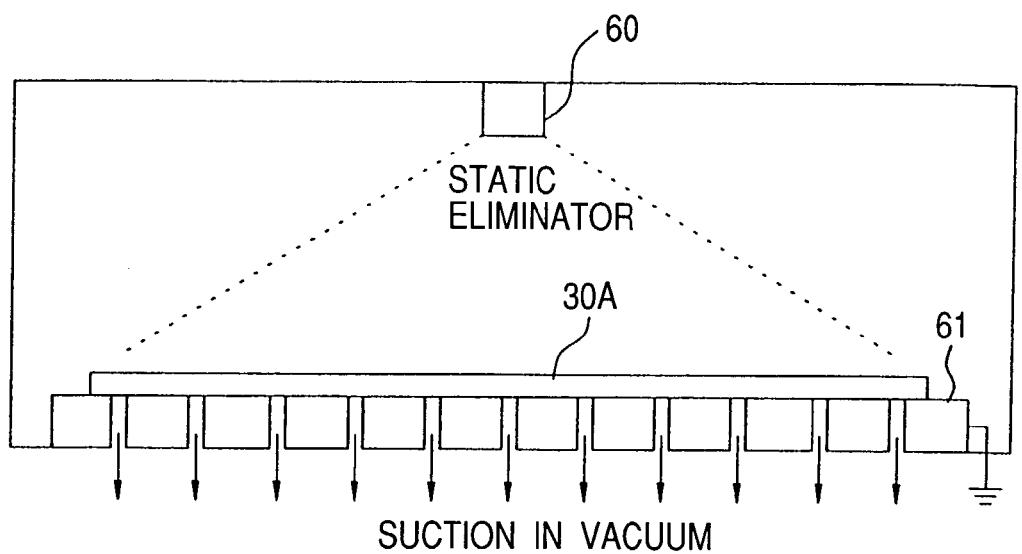
FIG. 22 is an illustrative view showing an example of a static eliminator used in the invention.
Figure 23:
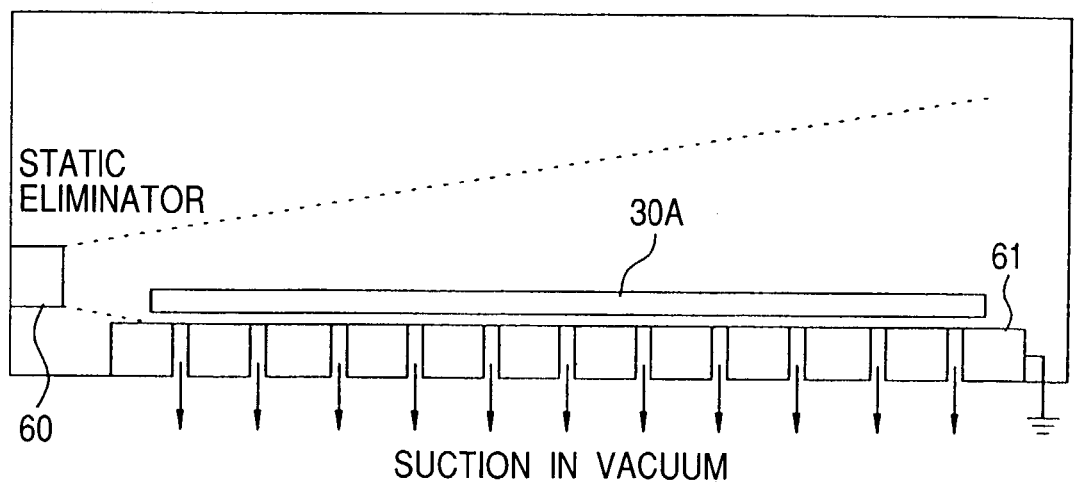
FIG. 23 is an illustrative view showing another example of a static eliminator used in the invention.

It is effective for antistatic measures that when the glass substrate 30A is processed at the main or back side thereof, a static eliminator 60 of the type as shown in FIG. 22 or 23, for example, is used to eliminate charged particles attached to the glass sheet 30A. FIG. 22 shows an instance where a static eliminator 61 is disposed above metal plates 61 supporting the glass sheet 30A, and FIG. 23 shows an instance where a static eliminator 60 is disposed at a side relative to metal sheets 61, and thus static elimination between the glass sheet 30A and the metal plates 61 is enabled in an efficient manner. The static eliminator 60 used is one wherein gas molecules in the vicinity of an object for static elimination are excited by application of a soft X ray having a wavelength of 0.13 to 0.14 $\mu$m and ionized into positive and negative ions, with which electric charges on the surface of a charged body are neutralized.

Embodiment 3

Figure 24:
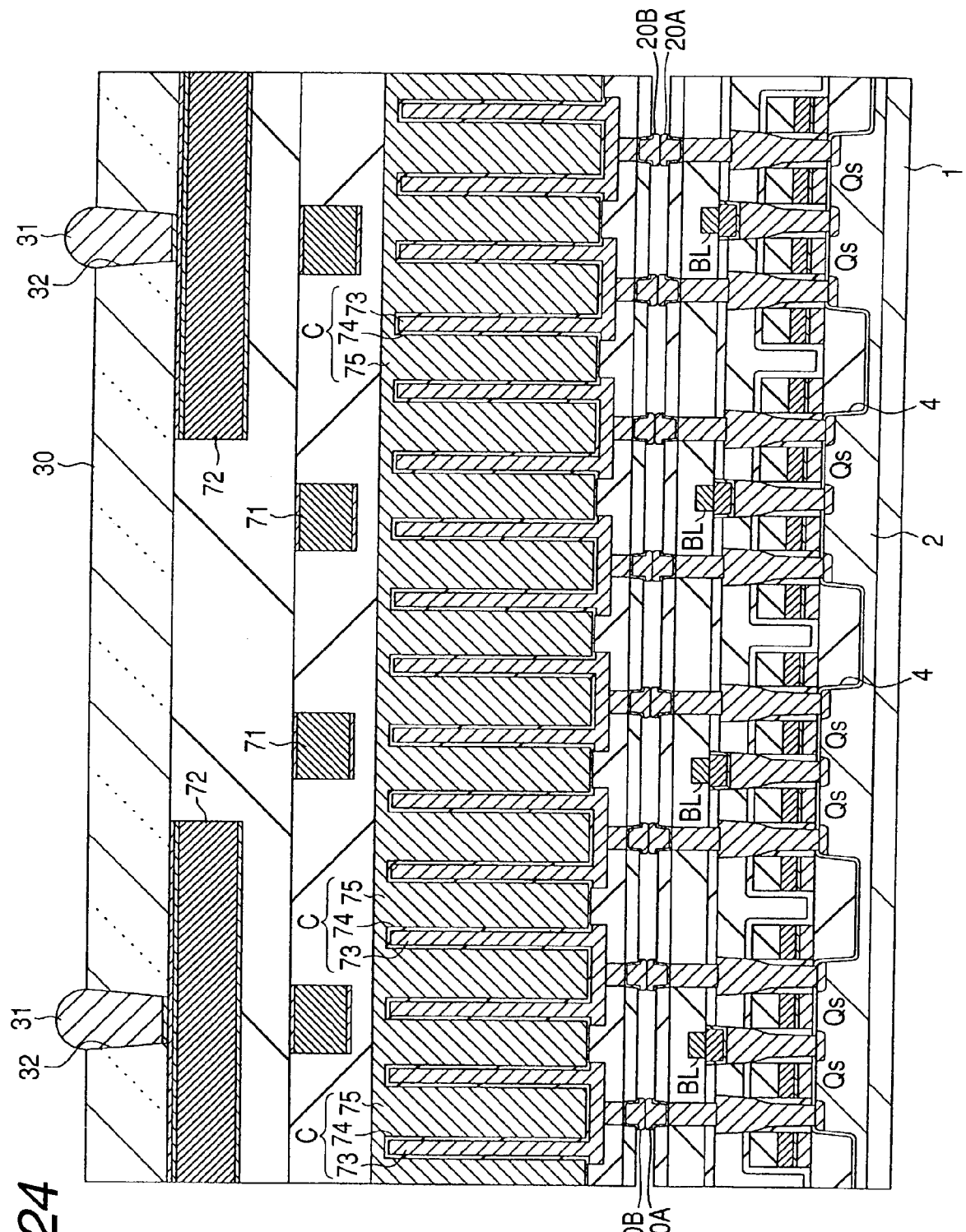
FIG. 24 is a sectional view of an essential part showing a semiconductor integrated circuit device according to Embodiment 3 of the invention.
Figure 25:
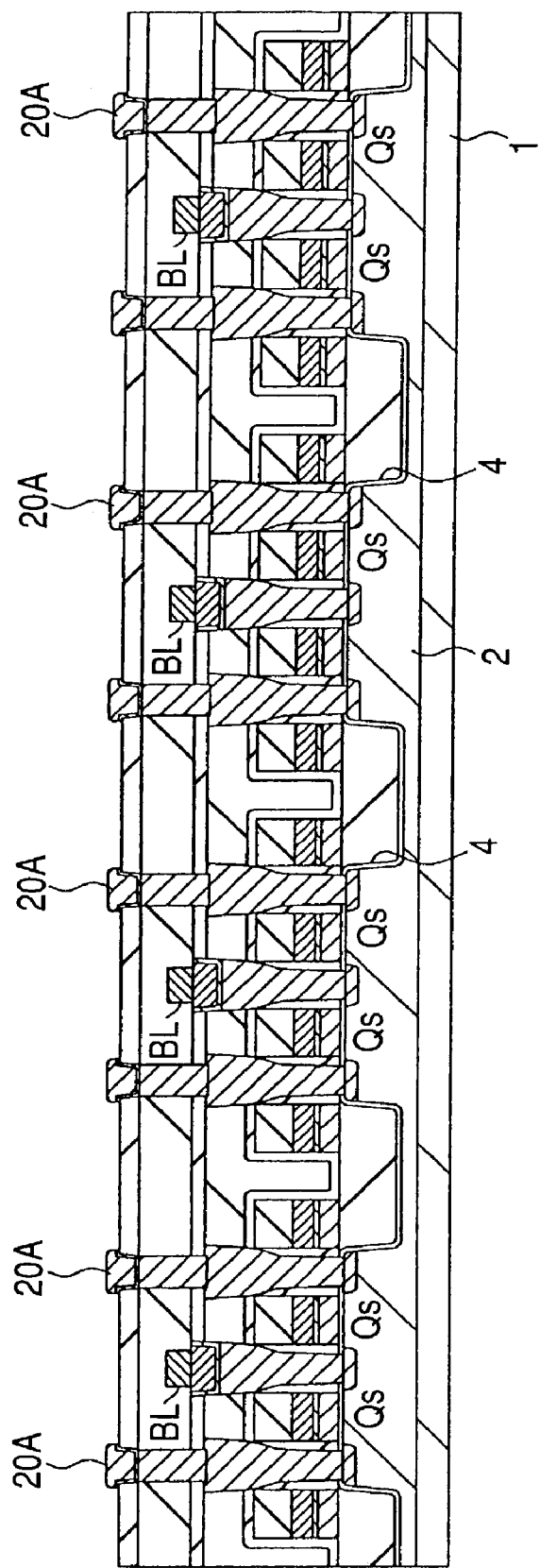
FIG. 25 is a sectional view of an essential part of a silicon substrate showing part of the semiconductor integrated circuit device shown in FIG. 24.
Figure 26:
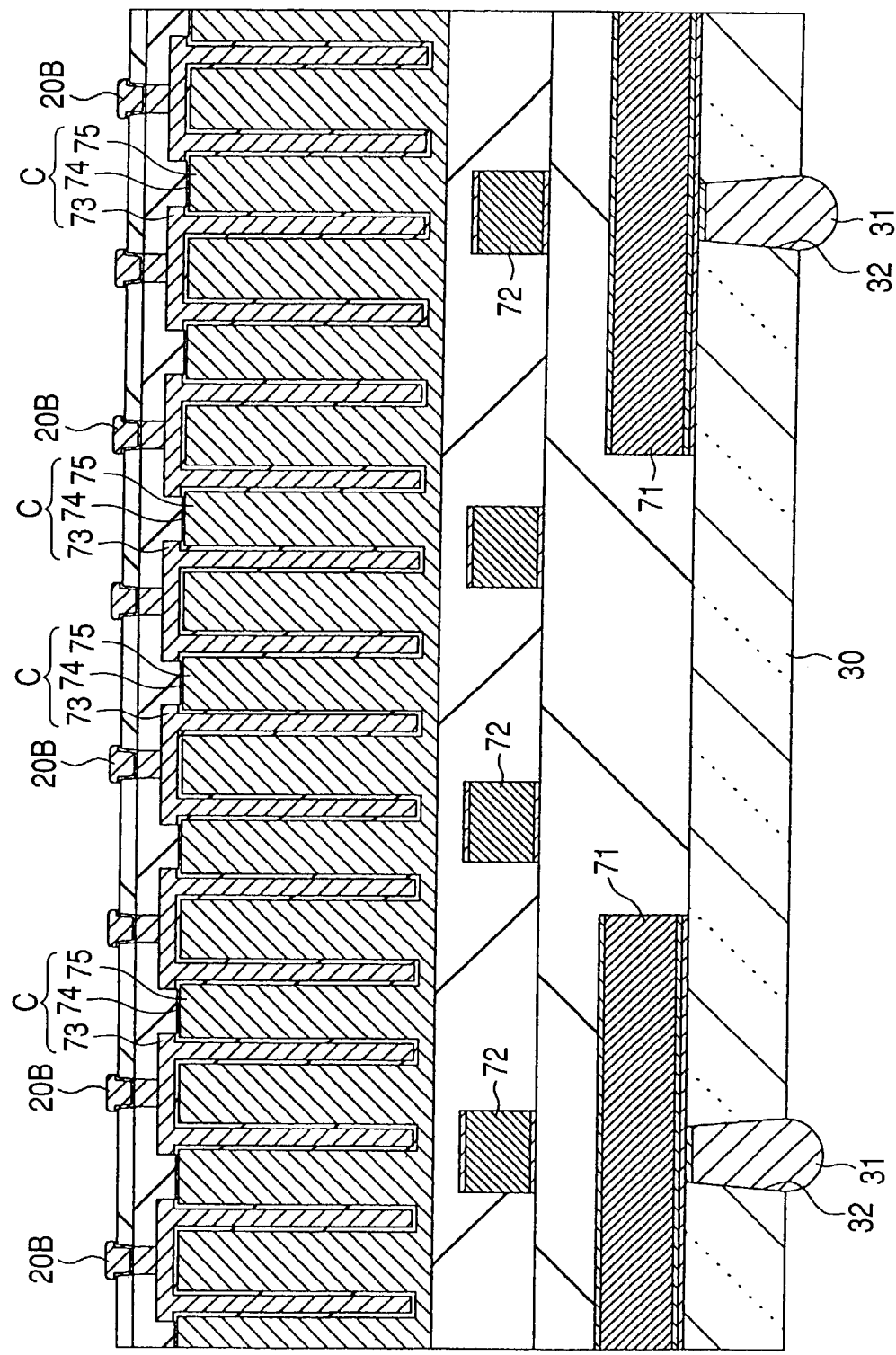
FIG. 26 is a sectional view of an essential part of a glass substrate showing other part of the semiconductor integrated circuit device shown in FIG. 24.

A semiconductor integrated circuit device of this embodiment is DRAM (dynamic random access memory) including a stacked capacitor structure wherein capacitors C, which are, respectively, a data storage capacitor of a memory cell, are arranged above MISFET's Qs for memory cell selection. FIG. 24 is a sectional view showing an essential part (memory cell array) of the integrated circuit device. FIG. 25 is a sectional view of an essential part showing a portion where MISFET's Qs for memory cell selection constituting part of memory cells and bit lines BL reading out information of the memory cells, and FIG. 26 is a sectional view of an essential part showing a portion where capacitors C constituting other part of the memory cells are formed along with a first-layer wiring 71 and a second-layer wiring 72.

As shown, this DRAM is arranged such that MISFET's Qs for memory cell selection constituting part thereof and bit lines BL are formed on the main surface of a silicon substrate 1, and the capacitors C serving as other part thereof, the first-layer wiring 71 and the second-layer wiring 72 are formed on the main surface of the glass substrate 30 different from the silicon substrate 1. A plurality of microbumps 20A formed at the uppermost portion of the silicon substrate 1 and a plurality of microbumps 20B formed at the uppermost portion of the glass substrate 30 are superposed as shown in FIG. 25 and mutually electrically connected with one another to constitute DRAM as a whole.

More particularly, this DRAM is realized by a manufacturing process (wafer process) divided into halves wherein the first half steps of forming the MISFET's Qs for memory cell selection and the bit lines BL and the latter half steps of forming the capacitors C, the first-layer wiring 71 and the second-layer wiring 72 are, respectively, performed on the silicon substrate 1 and glass substrate 30.

The first half steps of forming the MISFET's Qs for memory cell selection and the bit lines BL are realized by a known DRAM process. This process is described in detail, for example, in Japanese Patent Application No. Hei 11(1999)-166320. The step of forming a plurality of microbumps at the uppermost portion of the silicon substrate 1 wherein the MISFET's Qs for memory cell selection and the bit lines BL have been formed is similar to the step illustrated in the foregoing Embodiment 1. A probe is applied to these microbumps 20A to test electric characteristics, after which the silicon wafer 1A is divided into a plurality of silicon substrates 1 by dicing to obtain the silicon substrate (chip) 1 shown in afore-indicated FIG. 26.

On the other hand, the latter half steps of forming, on the glass substrate, the capacitors C, the first-layer wiring 71 and the second-layer wiring 72 are carried out in an order reverse to an ordinary DRAM manufacturing process. More particularly, according to an ordinary DRAM manufacturing process, a lower electrode 73, a capacitive insulating film 74 and an upper electrode 75 of the capacitor C are formed in this order, followed by formation of a first-layer wiring 71 and a second-layer wiring 72 at the upper portion of the capacitor C in this order.

In contrast, according to the manufacturing method of this embodiment, a second-layer wiring 72 serving as an uppermost wiring is formed over the glass substrate 30, and a first-layer wiring 71 is formed on the second-layer wiring 72, after which an upper electrode 75, a capacitive insulating film 74 and a lower electrode 73 of the capacitor C are formed over the first-layer wiring 71 in this order.

The first-layer wiring 71 and the second-layer wiring 72 are made, for example, of a metal such as an Al alloy, Cu, W or the like, respectively. The upper electrode 75 and the lower electrode 73 of the capacitor C are, respectively, constituted of a polysilicon, TiN, Ru (ruthenium), W or the like, and the capacitive insulating film 74 is constituted of a high dielectric substance (ferroelectric substance) such as $Ta_2O_5$ (tantalum oxide), BST ((Ba, Sr)$TiO_3$), PZT (Pb$Zr_x$T$I_{1-x}O_3$), PLT (PbL$a_x$T$i_{1-x}O_3$) PLZT, Pb$TiO_3$, Sr$TiO_3$. Ba$TiO_3$ or the like.

Where the capacitive insulating film 74 of the capacitor C is formed of such a ferroelectric as mentioned above, it is necessary that a ferrodielectric film be deposited and thermally treated (annealed) in an atmosphere of oxygen at about 700° C. or over to repair oxygen defectives in the film. In a conventional DRAM manufacturing process, there is the possibility that the characteristics of the MISFET's Qs for memory cell selection degrade owing to the high temperature thermal treatment. In contrast, according to the manufacturing method of this embodiment, the memory cell selection MISFET's Qs and the capacitors C are, respectively, formed in different substrates, so that such a disadvantage as mentioned above can be avoided. More particularly, according to the manufacturing method of this embodiment where the MISFET's Qs and the capacitors C are formed on different types of substrates, respectively, the characteristics of DRAM can be improved, thereby leading to improved reliability and yield.

The step of forming a plurality of microbumps 20B at the uppermost portion of the glass substrate 1 and the step of forming the bump electrodes 31 at the back side of the glass substrate 1 are the same as those illustrated in the foregoing Embodiment 1. A probe is applied to these microbumps 20B to perform a test of electric characteristics thereof, after which the glass sheet 30A is diced for division into a plurality of glass substrates 30 to obtain a glass substrate 30 shown in the afore-indicated FIG. 26.

FIG. 27($a$) is a view conceptually showing a manufacturing method of such an embodiment as set out hereinabove, and FIG. 27($b$) is a view conceptually showing a conventional manufacturing method of DRAM. In the figures, one step is expressed in terms of one photomask, and a plurality of consecutive steps are expressed by a plurality of superposed photomasks.

Like the foregoing Embodiment 1, in the manufacturing method of this embodiment, all the steps ($M_0$ to $M_d$) of a wafer process are divided into first half steps A ($M_0$ to $M_m$) and latter half steps ($M_{m+1}$ to $M_n$). The first half steps ($M_0$ to $M_n$) are realized on a first substrate (silicon substrate 1 herein) in an ordinary order, and the latter half steps B ($M_{m+1}$ to $M_n$) are realized on a second substrate (glass substrate 30 herein) in an order ($M_n \to M_{m+1}$) reverse to an ordinary order.

At the final stage of the steps A ($M_0 \to M_m$), a test of electric characteristics is conducted to extract a non-defective first substrate, and at the final stage of the steps B ($M_n \to M_{m+1}$), a test of electric characteristics is conducted to extract a non-defective second substrate, after which the non-defective first substrate and the non-defective second substrate are connected with each other via the microbumps to obtain a completed product for which all the steps ($M_0$ to $M_n$) of the wafer process have been realized.

According to such a manufacturing method as set out above, two manufacturing lines are used to permit the first half steps A ($M_0 \to M_m$) and the latter half steps ($M_n \to M_{m+1}$) to proceed simultaneously and run parallel to each other. Thus, the turn around time (TAT) required for the completion of the product of the first half steps can be drastically shortened. The first half steps A ($M_0$ to $M_m$) and the latter half steps B ($M_{m+1}$ to $M_n$) are separately realized on the first and second substrates, and thus a percent defective that increases cumulatively with an increasing number of steps can be substantially reduced, thus leading to are remarkable improvement in the manufacturing yield of the product.

The manufacturing method of the embodiment wherein the MISFET's Qs for memory cell selection and the capacitors C are formed on different types of substrates may be applied, aside from DRAM, to a method of manufacturing a ferromagnetic memory that makes use, for example, of polarization reversal of a ferromagnetic material for memory retention.

The DRAM manufactured in this way becomes a final product by sealing the silicon substrate 1 and the glass substrate 30 in a package. The manner of sealing may take various forms using existing packages.

Figure 28:
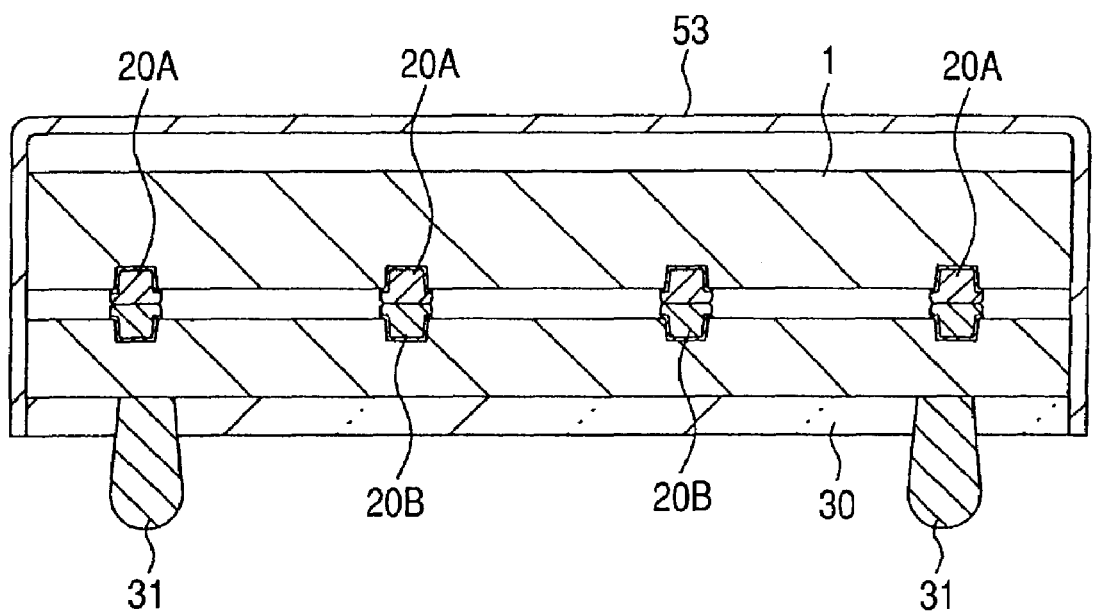
FIG. 28 is a sectional view showing the state where the semiconductor integrated circuit device of Embodiment 3 of the invention is sealed in a package.

It will be noted that if there is the possibility that the memories formed at the silicon substrate 1 undergo malfunction by irradiation with light incident from the side of the glass substrate 30, it is effective to seal the silicon substrate 1 with a cap 53 covering the side faces of the glass substrate 30 as shown in FIG. 28.

Embodiment 4

Figure 29:
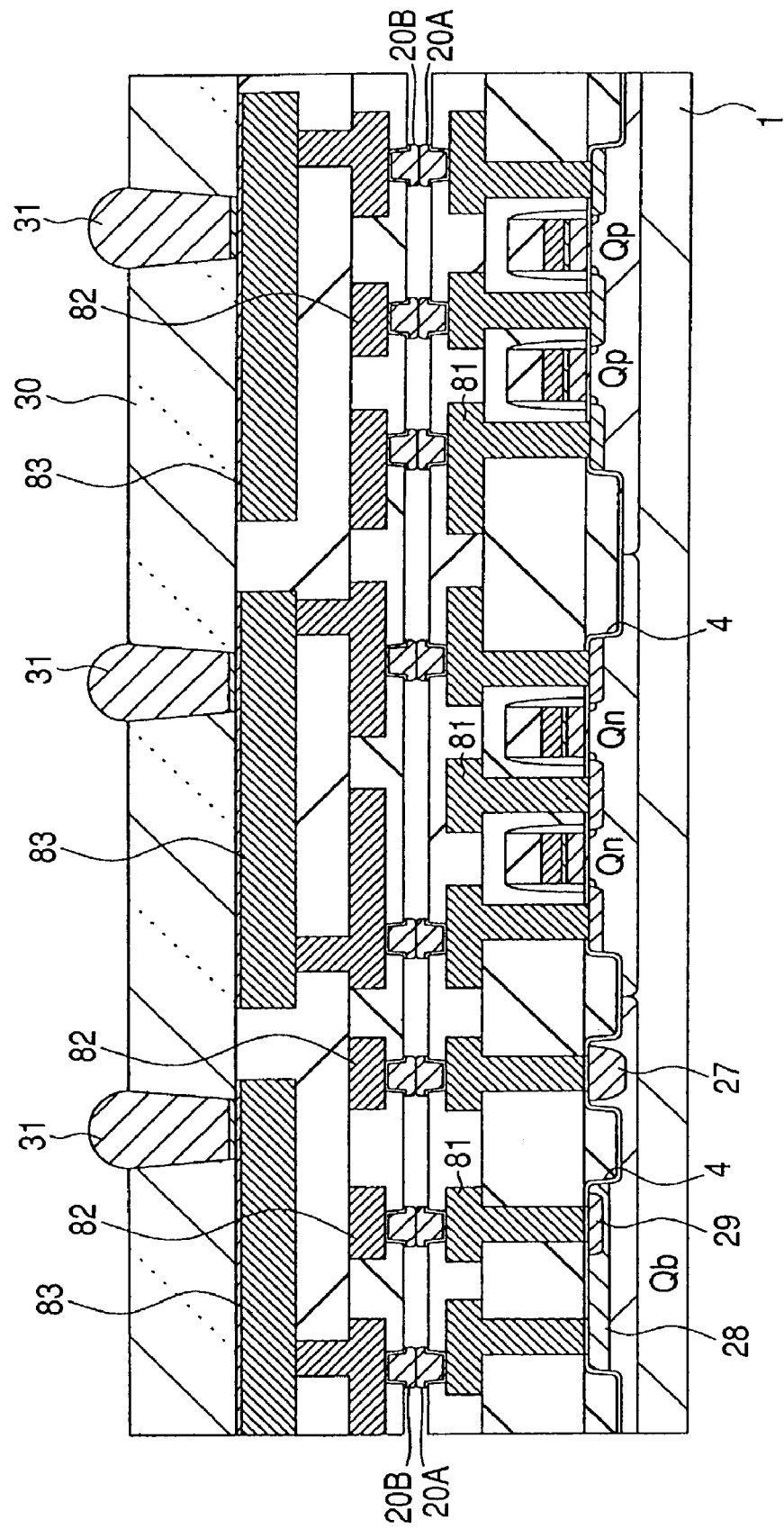
FIG. 29 is a sectional view of an essential part showing a semiconductor integrated circuit device according to Embodiment 4 of the invention.
Figure 30:
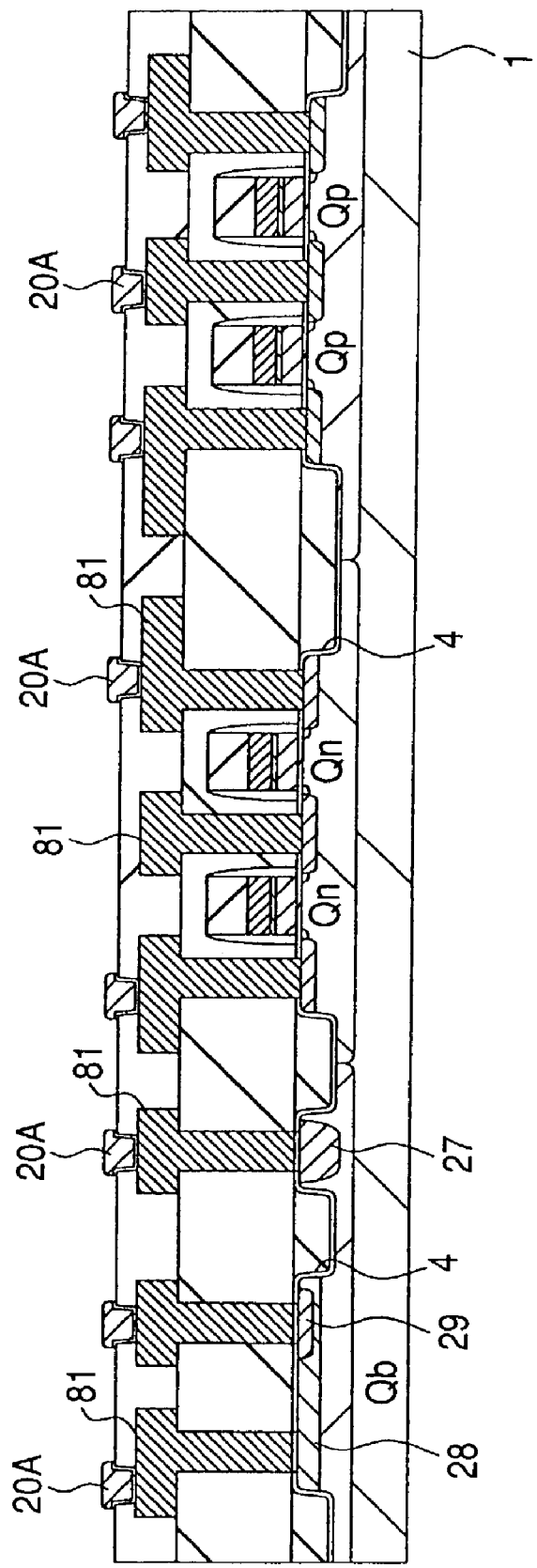
FIG. 30 is a sectional view showing an essential part of a silicon substrate showing a part of the semiconductor integrated circuit device shown in FIG. 29.
Figure 31:
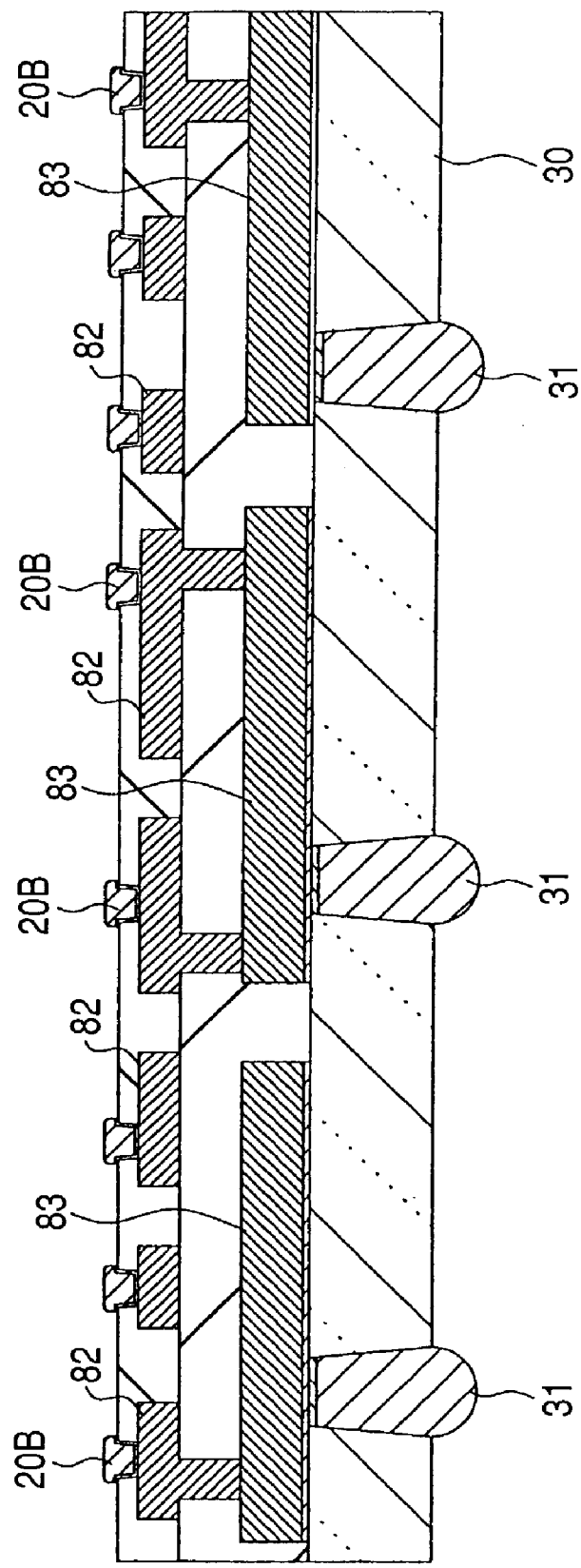
FIG. 31 is a sectional view of an essential part of a glass substrate showing other part of the semiconductor integrated circuit device shown in FIG. 29.

The semiconductor integrated circuit device of this embodiment is directed to a bipolar CMOS LSI for high frequency, and FIG. 29 is a sectional view showing an essential part thereof. FIG. 30 is a sectional view of an essential part showing a portion where a bipolar transistor Qb, n-channel MISFET's Qn, p-channel MISFET's Qp and a first-layer wiring 81, which serve as part of the LSI, are formed, and FIG. 31 is a sectional view of an essential part showing a portion where a second-layer wiring 82 and a third-layer wiring 83 serving as other part of this LSI.

As shown, the bipolar CMOS LSI has, as a part thereof, a bipolar transistor Qb, n-channel MISFET's Qn, p-channel MISFET's Qp and the first-layer wiring 81 formed on the main surface of the silicon substrate 1, and also has, as other part thereof, the second-layer wiring 82 and the third-layer wiring 83 formed on the glass substrate 30 different from the silicon substrate 1. The plural microbumps 20A formed at the uppermost portion of the silicon substrate 1 and the plural microbumps 20B formed at the uppermost portion of the glass substrate 30 are correspondingly superposed as shown in FIG. 31, thereby permitting electric connection therebetween to constitute the bipolar CMOS LSI as a whole.

More particularly, for the manufacture of this LSI, the manufacturing process is divided into two groups, that is, the first half steps of forming the bipolar transistor Qb, n-channel MISFET's Qn, p-channel MISFET's Qp and the first-layer wiring 81 on the main surface of the silicon substrate 1, and the latter half steps of forming the second-layer wiring 82 and the third-layer wiring 83 on the glass substrate 30. The first half steps and the latter half steps are carried out using different manufacturing lines and run parallel to each other.

The first half steps of forming the bipolar transistor Qb, n-channel MISFET's Qn, p-channel MISFET's Qp and the first-layer wiring 81 on the silicon substrate 1 are carried out by a known bipolar CMOS process. The step of forming the plural microbumps 20A at the uppermost portion of the silicon substrate 1 is the same as that illustrated in the foregoing Embodiment 1.

On the other hand, the latter half steps of forming the second-layer wiring 82 and the third-layer wiring 83 on the glass substrate 30 is carried out in an order reverse to those of an ordinary procedure. More particularly, according to the manufacturing steps of this embodiment, the third-layer wiring 83 is initially formed on the glass substrate 30, followed by further formation of the second-layer wiring 82 on the third-layer wiring 83. It will be noted that the step of forming the plural microbumps at the uppermost portion of the glass substrate 1 and the step of forming the bump electrodes 31 at the back side of the glass substrate 1 are, respectively, the same as those illustrated with respect to the foregoing Embodiment 1.

According to this embodiment, the silicon substrate a and the glass substrate 30 whose analog characteristics are uniform can be used in combination, so that the bipolar CMOS LSI having improve high frequency characteristics can be realized at low costs.

Embodiment 5

Figure 32:
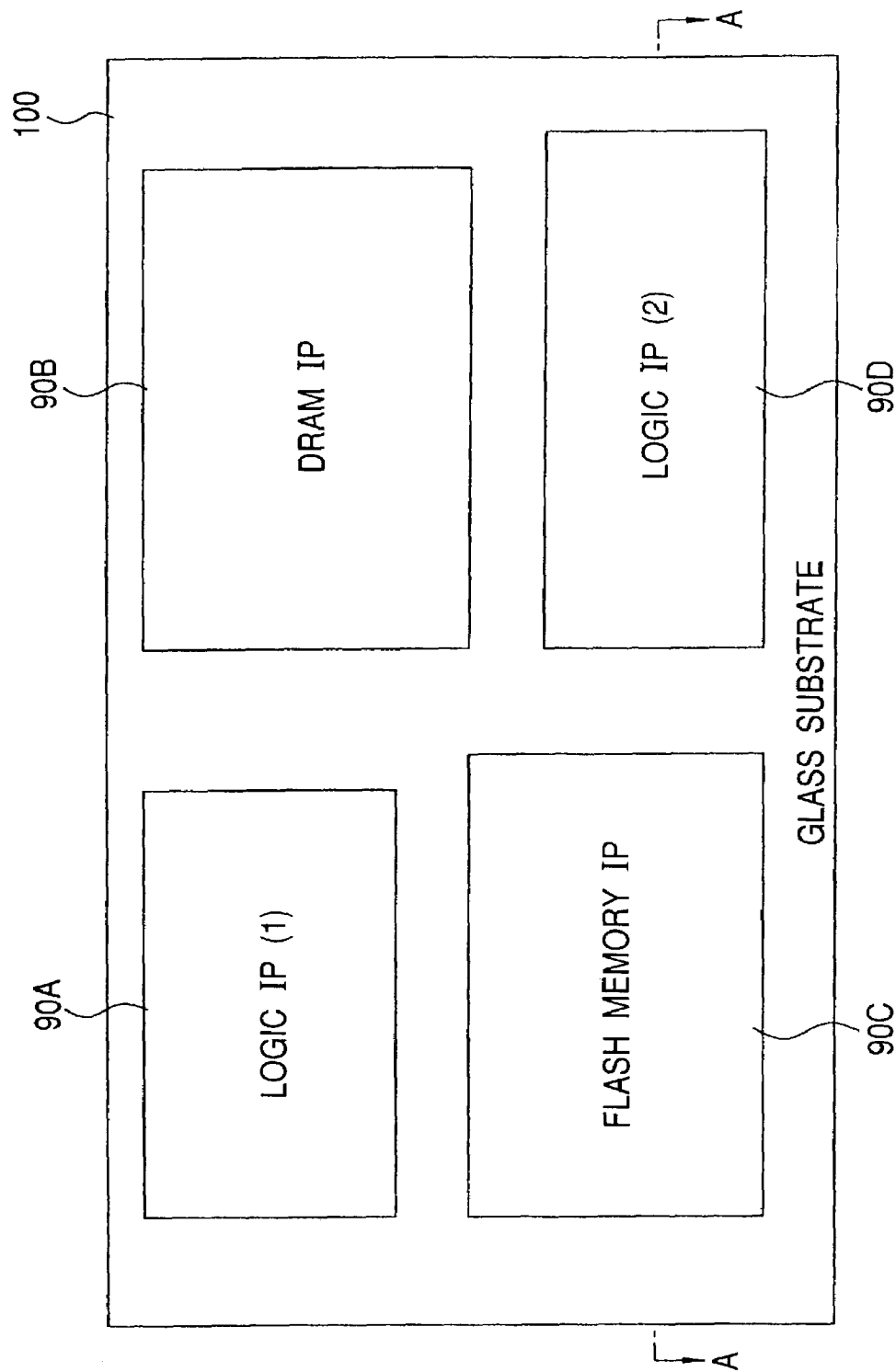
FIG. 32 is a schematic plan view of a semiconductor integrated circuit device according to Embodiment 5 of the invention.
Figure 33:
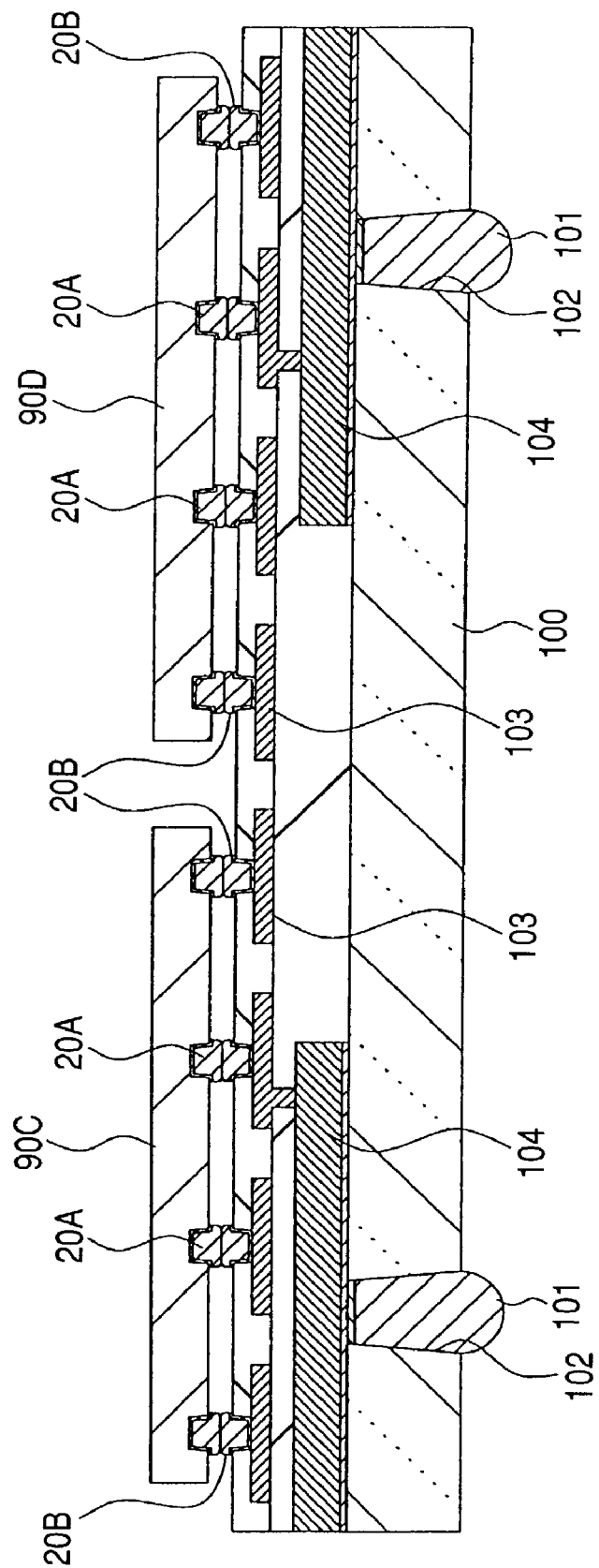
FIG. 33 is a sectional view taken along the line A—A of FIG. 32.

The semiconductor integrated circuit device of this embodiment is directed to a system LSI comprised of logic LSI and memory LSI. FIG. 32 is a plan view showing the system as a whole and FIG. 33 is a schematic sectional view taken along the line A—A of FIG. 32.

This system LSI is constituted of four functional blocks including, for example, logic IP (intellectual property) (1), logic IP (2), DRAM IP and flash memory IP. These four functional blocks are, respectively, formed after division into four silicon substrates (chips) 90A, 90B, 90C and 90D. These four silicon substrates 90A to 90D are mounted on a glass substrate 100 to form the system LSI as a whole.

The electric connection between the silicon substrates 90A to 90D and the glass substrate 100 is realized by contacting the plural microbumps 20A formed on the main surface of the silicon substrates 90A to 90D with the plural microbumps 20B formed on the main surface of the glass substrate 100, respectively.

Two-layer wirings 103, 104 are formed, for example, on the main surface of the glass substrate 100. At the back surface (lower surface) of the glass substrate 100, a plurality of bump electrodes 101 serving as external terminals of the system LSI are formed. These bump electrodes 101 are electrically connected to the wiring 104 via a through-hole 102 formed in the glass substrate 100.

The logic IP (1), which is one of the functional blocks of the system LSI, is made by a manufacturing process (wafer process) divided into two groups. For instance, the steps of forming a semiconductor element and part of multi-layered wirings and the steps of forming other part of the multi-layered wirings are realized separately on the silicon substrate 90A and the glass substrate 100. Likewise, the logic IP (2), DRAM IP and flash IP of the other functional blocks are, respectively, made by a manufacturing process (wafer process) divided into two groups, and the steps of forming a semiconductor element and part of multi-layered wirings and the step of forming other part of the multi-layered wirings are, respectively, realized separately on each of the glass substrates 90B, 90C and 90D and the glass substrate 100.

Figure 34:
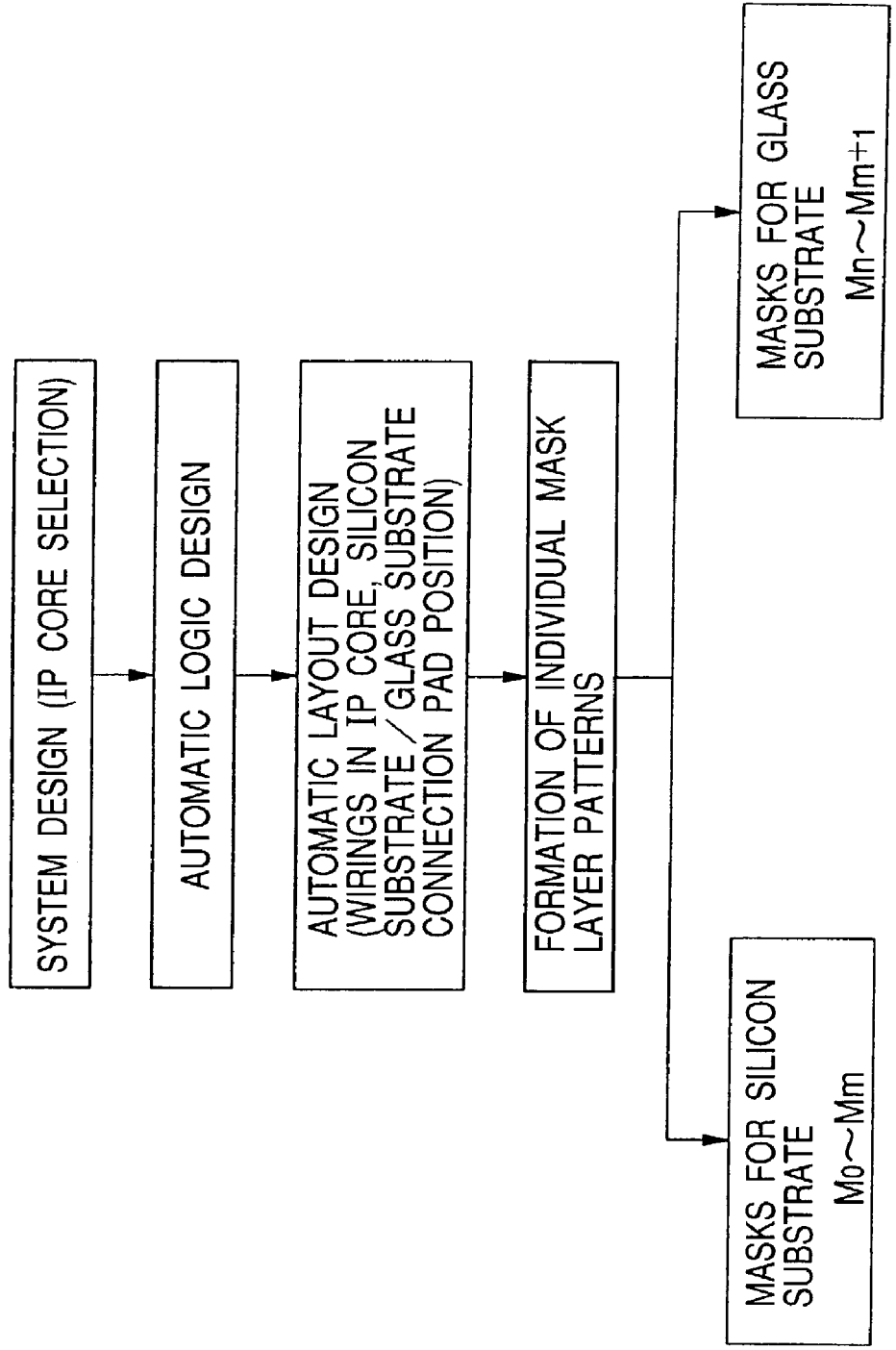
FIG. 34 is a view showing a design flowchart of the semiconductor integrated circuit device of Embodiment 5 of the invention.

The above system LSI is manufactured such that according to a design flow shown, for example in FIG. 34, photomasks used in the steps ($M_0$ to $M_m$) realized on the four silicon substrates 90A to 90D and photomasks used in the steps ($M_{m+1}$ to $M_n$) realized on one glass substrate 100 are made, respectively.

Figure 35:
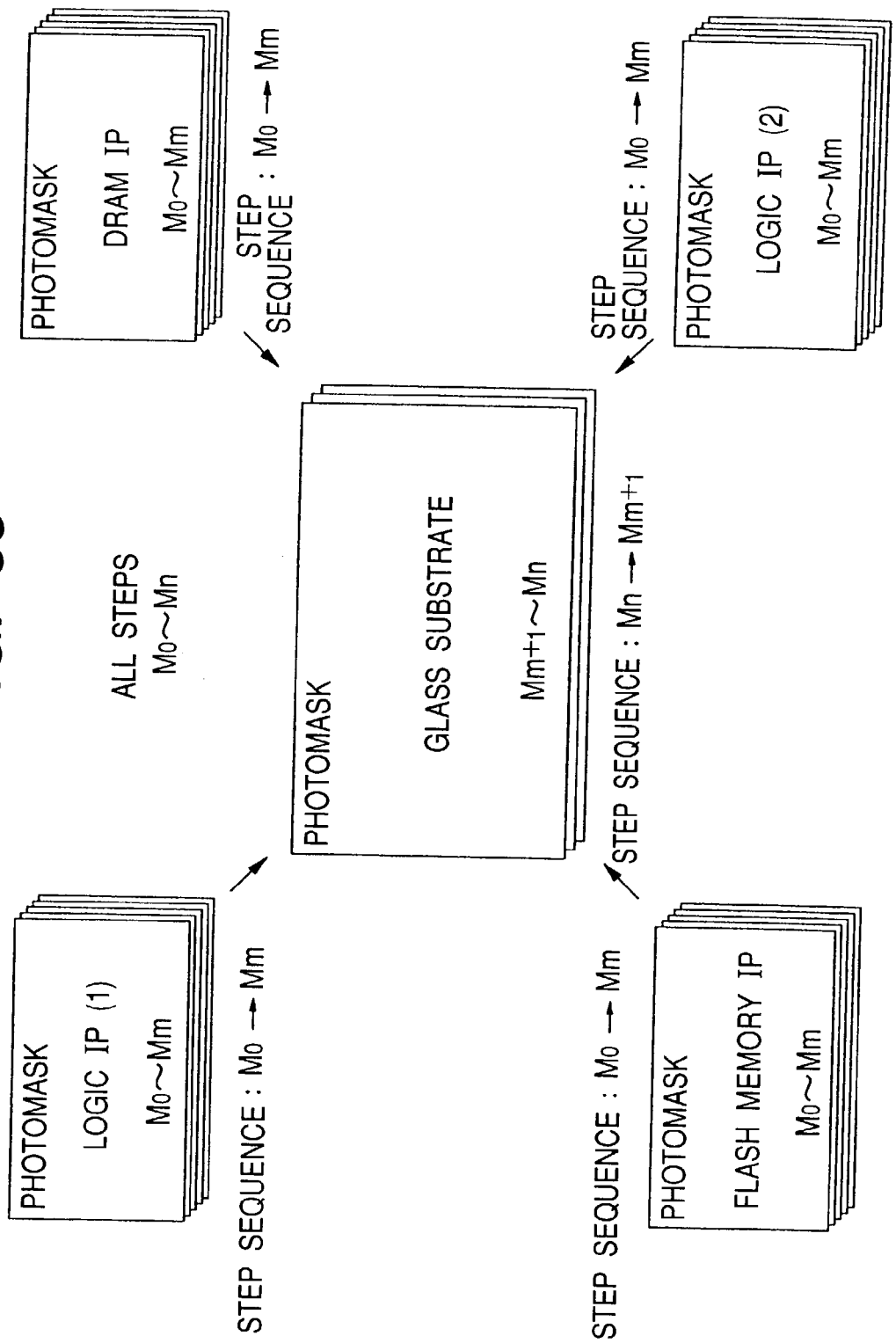
FIG. 35 is a view conceptually showing a method for manufacturing the semiconductor integrated circuit device of Embodiment 5 of the invention.
Figure 36:
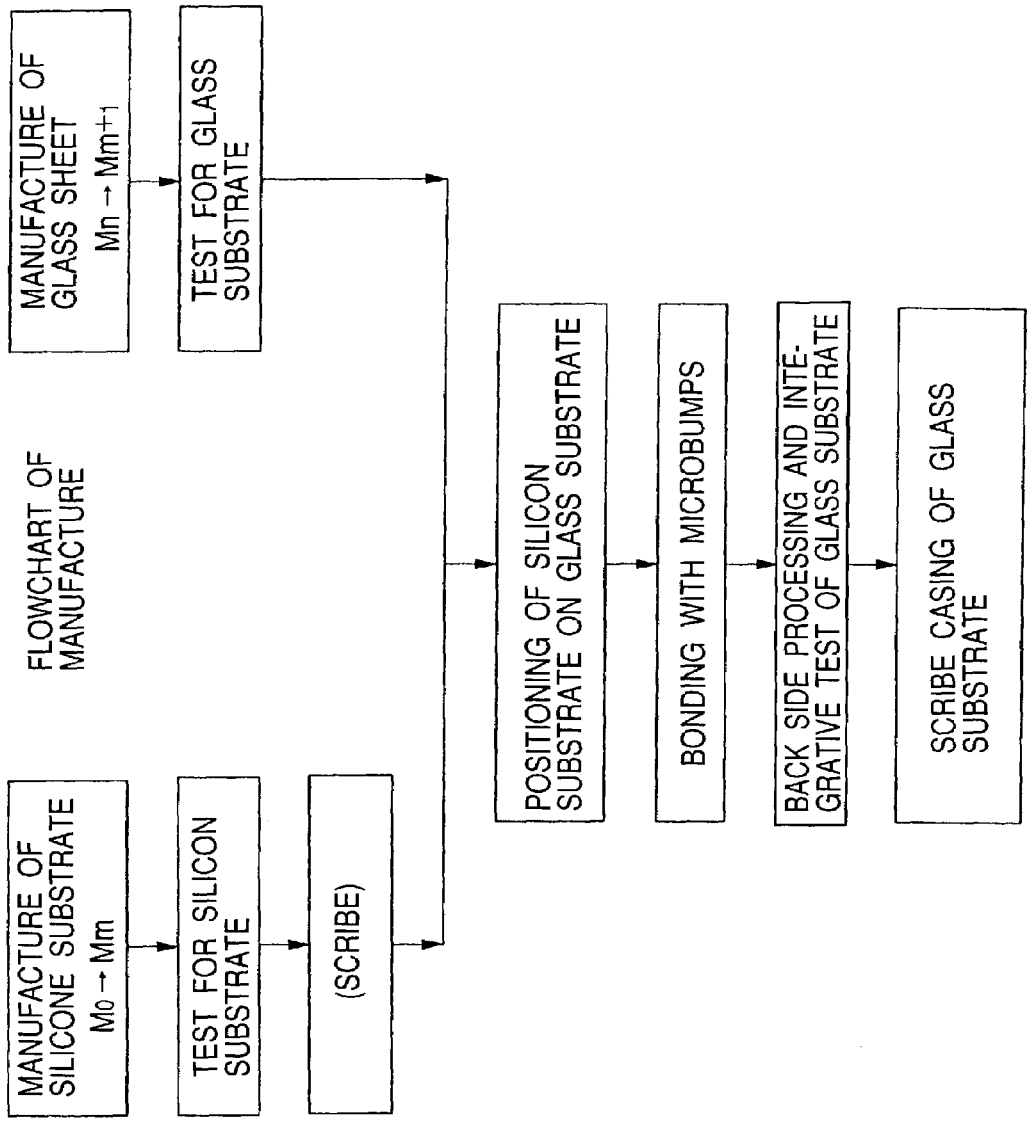
FIG. 36 is a view showing a manufacturing flowchart of the semiconductor integrated circuit device of Embodiment 5 of the invention.

FIG. 35 is a view conceptually showing a manufacturing method according to this embodiment, and FIG. 36 is a flowchart for the manufacture. In FIG. 35, one step is expressed in terms of one photomask, and plural consecutive steps are expressed by plural superposed photomasks. The numbers of steps realized on the silicon substrates 90A to 90D, respectively, differ depending on the functional block. For convenience's sake, the numbers of the steps required for the silicon substrates 90A to 90D are all the same at ($M_0$ to $M_m$) herein.

In accordance with the manufacturing method of this embodiment, all the steps ($M_0$ to $M_n$) of a wafer process of one functional block (e.g. logic IP (1)) are divided into the steps A ($M_0$ to $M_m$) and the steps B ($M_{m+1}$ to $M_n$). The steps A ($M_0$ to $M_m$) are realized on a first substrate (e.g. silicon substrate 90A) in an ordinary order ($M_0 \rightarrow M_m$), and the steps B ($M_{m+1}$ to $M_n$) are realized on a second substrate (e.g. glass substrate 100) in an order reverse to the ordinary order ($M_n \rightarrow M_{m+1}$). At the final state of the steps A ($M_0$ to $M_m$), a probe is applied to the microbumps 20A to conduct a test for electric characteristics to extract a non-defective first substrate (silicon substrate 90A).

Likewise, with respect to the other functional blocks, all the steps of each wafer process are divided into the steps A ($M_0$ to $M_m$) and the steps B ($M_{m+1}$ to $M_n$) The steps A ($M_0$ to $M_m$) are realized on a first substrate (e.g. silicon substrate 90B, 90C or 90D) in an ordinary order ($M_0 \rightarrow M_m$), and the steps B ($M_{m+1}$ to $M_n$) are realized on a second substrate (e.g. glass substrate 100) in an order reverse to the ordinary order ($M_n \rightarrow M_{m+1}$). At the final state of the steps A ($M_0$ to $M_m$), a probe is applied to the microbumps 20A to conduct a test for electric characteristics to extract a non-defective first substrate (silicon substrate 90B, 90C or 90D).

At the final stage of the steps ($M_n \rightarrow M_{m+1}$), a test for electric characteristics is conducted to extract a non-defective second substrate (glass substrate 100), and the non-defective first substrates (silicon substrates 90A, 90B, 90C and 90D) and the non-defective second substrate (glass substrate 100) are electrically connected with one another via the microbumps 20A, 20B.

According to such a manufacturing method as set forth above, the steps A ($M_0$ to $M_m$) and the steps B ($M_{m+1}$ to $M_n$) for the respective functional blocs can run simultaneously in parallel to one another by use of a plurality o manufacturing lines, so that the turn around time (TAT) required for the completion of a product can be shortened considerably. In addition, when the steps A ($M_0$ to $M_m$) and the steps B ($M_{m+1}$ to $M_n$) for the respective functional blocks are realized separately on the first substrate and the second substrate, a percent defective that increases cumulatively with an increasing number of steps can be significantly reduced, thereby remarkably improving the manufacturing yield of products.

Further, when the respective steps A ($M_0$ to $M_m$) for the plural functional blocks are realized separately on a plurality of the first substrates, the steps of the respective first substrates can be reduced in number in comparison with the case where the respective steps A ($M_0$ to $M_m$) for the plural functional blocks are realized on a single first substrate as loaded in a mixed condition, and the processes of the respective functional blocks can be optimized, thus leading to improved reliability and manufacturing yield of products.

Where the manufacturing steps of the respective functional blocks are realized separately on the silicon substrates 90A to 90D and the glass substrate 100, an active element and wirings formed according to fine design rules are formed on the silicon substrates 90A to 90D, and wide wirings and a passive component are formed on the glass substrate 100. This permits the silicon substrates 90A to 90D to be made small in size and the functional blocks to be mounted on the glass substrate 100 in high density. The steps common to the four functional blocks should be realized on the glass substrate 100 to a fullest possible extent, thus leading to a reduced number of steps.

Figure 37:
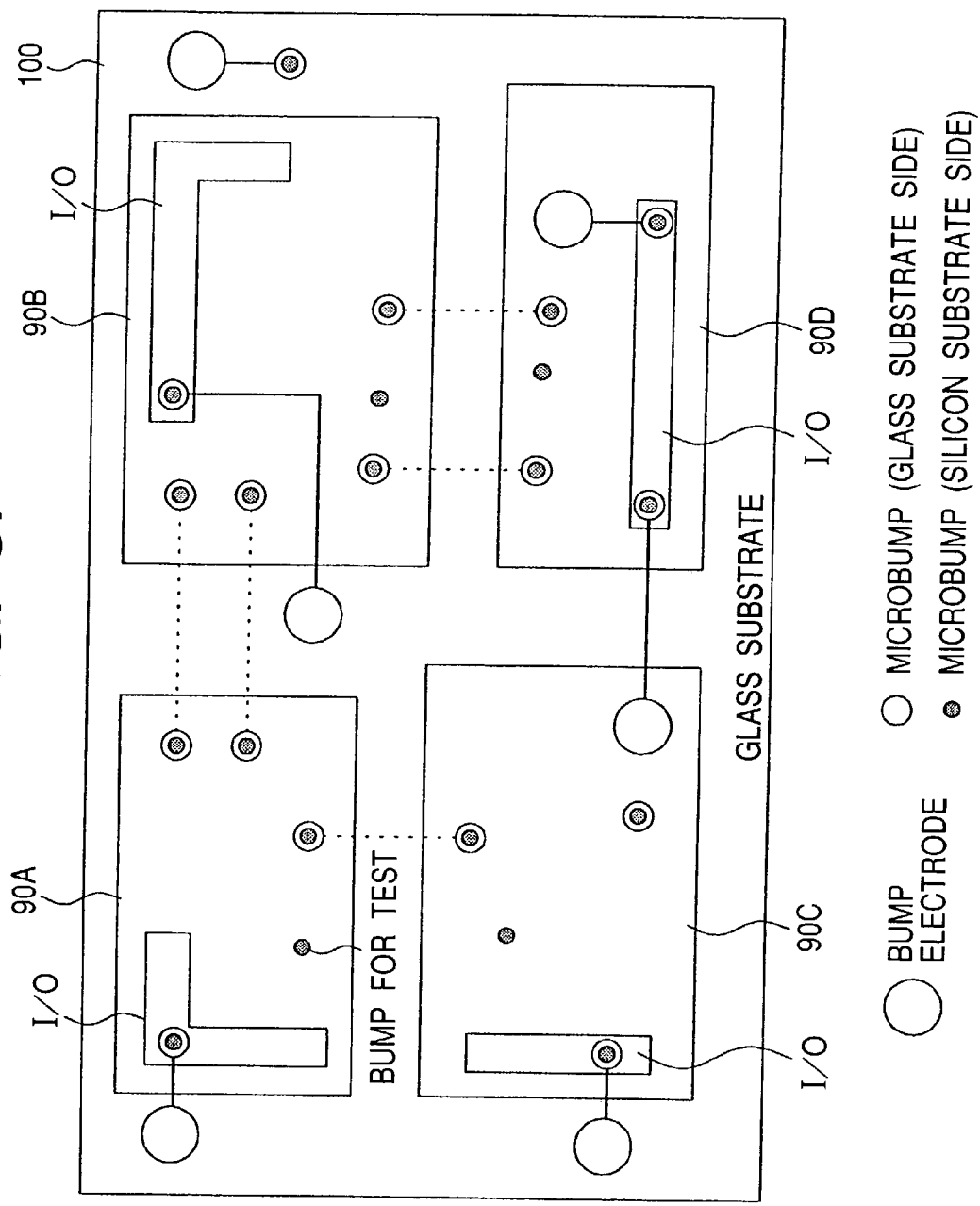
Figure 38:
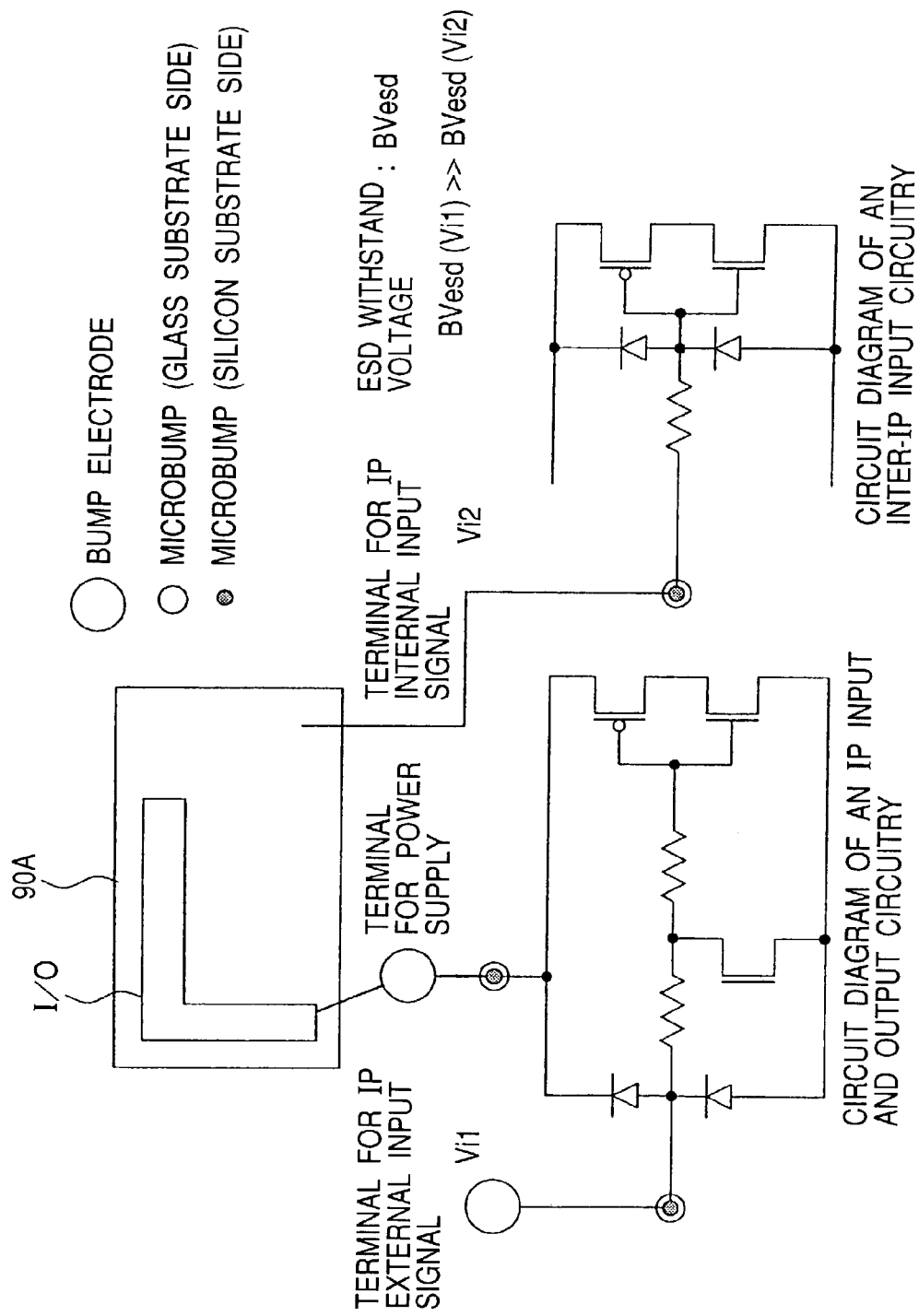
FIG. 38 is an illustrative view showing a protecting circuit formed in the input and output circuit shown in FIG. 37.

As shown in FIG. 37, an input and output circuit (I/O), which is provided with a protection circuit made of a clamping diode or a resistor element, is formed on the main surface of the respective silicon substrates 90A, 90B, 90C and 90D. In this case, a protection circuit of a high withstand voltage is formed, as shown in FIG. 38, at the input and output circuit portion which is connected to an external connection terminal of the glass substrate 100 via the microbumps 20A, 20B. For instance, when a protection circuit at the input and output circuit portion, which is not connected to an external connection terminal (bump electrode 101) such as a signal input and output circuit between functional blocks, is formed as a simpler protection circuit, an occupying area of the input and output circuit (I/O) can be made so small as to enable the silicon substrates 90B, 90C and 90D to be reduced in size.

Figure 39:
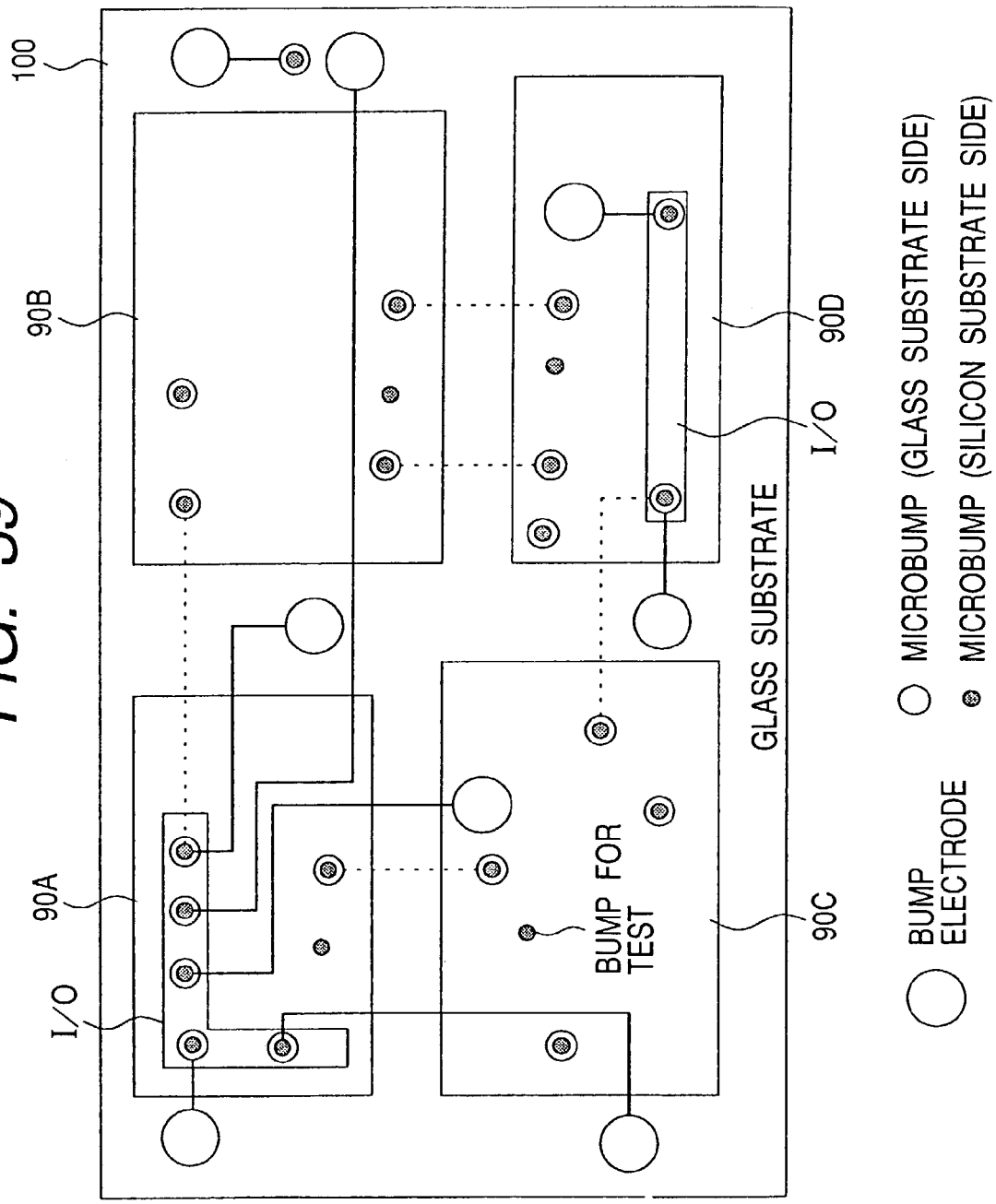
FIG. 39 is a plan view showing another example of an input and output circuit of the semiconductor integrated circuit device of Embodiment 5 of the invention.

As shown in FIG. 39, no input and output circuit (I/O) may not be provided at some of the silicon substrates 90A, 90B, 90C and 90D (e.g. the silicon substrates 90B and 90C formed with the memory LSI). In this case, the connection between the silicon substrates (90B, 90C) provided with no input and output circuit (I/O) and the external connection terminals (bump electrodes 101) is established via the input and output circuits (I/O) of the silicon substrates 90A, 90D. This permits the silicon substrates 90B, 90C formed with the memory LSI to be reduced in size or the memory LSI to be made large in capacity.

The glass substrate 100 may mount, on the main surface thereof, a passive component such as chip capacitor and CSP (chip size package) made by an ordinary wafer process along with the silicon substrates 90A to 90D.

Figure 40:
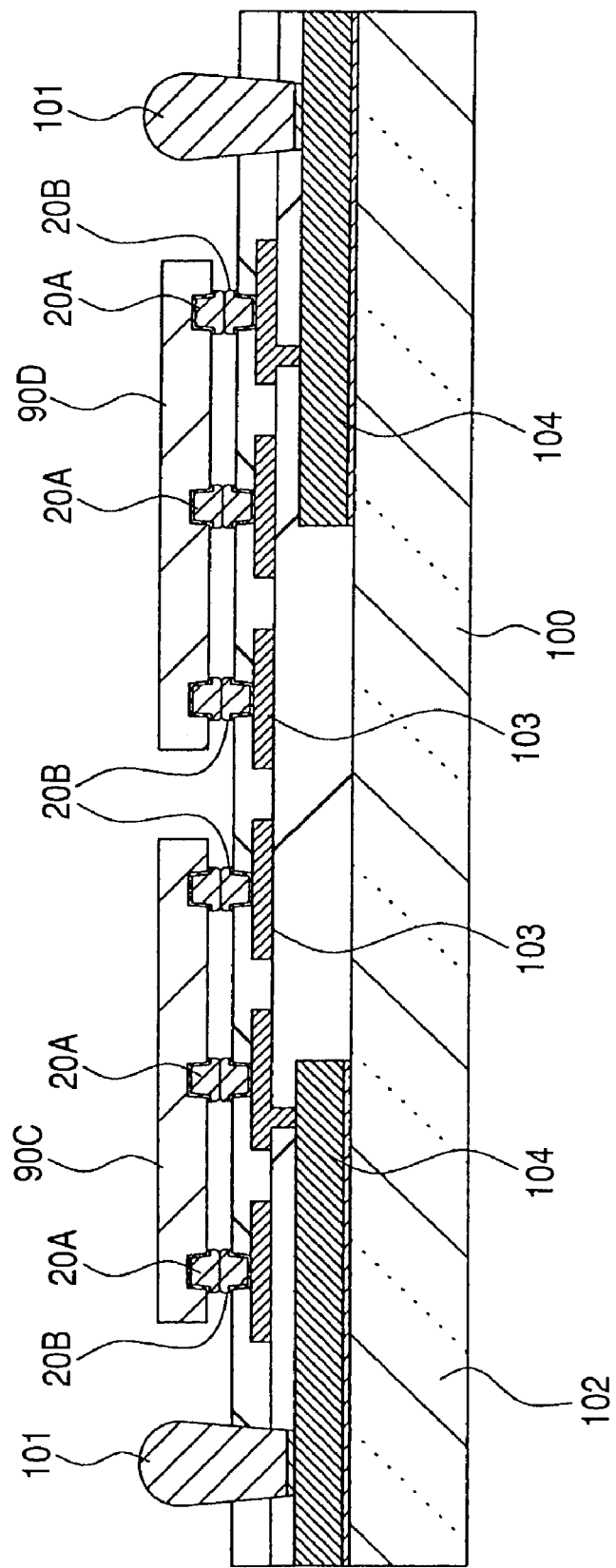
FIG. 40 is a sectional view of an essential part of a semiconductor integrated circuit device according to a further embodiment of the invention.

Furthermore, as shown in FIG. 40, in order to optimize the processes for the respective functional blocks, multi-layered wiring may be formed by dividing the formation procedure into two groups so that signal wirings constituting the respective functional blocks are connected via the multi-layered wirings formed on the respective silicon substrates 90A to 90D, and signal wirings for connection between different functional blocks are connected via the multi-layered wirings formed on the glass substrate 100.

The process of forming the multi-layered wirings on the glass substrate may differ from a process of forming the multi-layered wirings on the respective silicon substrates 90A to 90D. For instance, the interlayer insulating film may be constituted of an epoxy resin deposited by a coating method in place of the silicon oxide film deposited by a CVD method.

Moreover, a final protection film (passivation film) formed by an ordinary wafer process may be formed over the MISFET's and the multi-layered wirings formed by realizing the steps ($M_0$ to $M_m$) for the respective silicon substrates 90A to 90D so as to protect them.

The invention has been particularly described based on the embodiments made by the present invention, which should not be construed as limiting the invention. Many alterations and variations may be possible without departing from the spirit of the invention Industrial Utility Such a structure is provided that a first substrate wherein part of an integrated circuit is formed and a second substrate wherein other part of the integrated circuit device is formed are arranged such that the main surfaces are facing each other. The part of the integrated circuit and the other part of the integrated circuit are electrically connected with each other via a first connection terminal formed at the first substrate and a plurality of second connection terminals formed at the second substrate. This permits the semiconductor integrated circuit device to be improved in manufacturing yield and the turn around time (TAT) to be shortened.

The invention claimed is:

1. A semiconductor integrated circuit device, comprising:
a semiconductor substrate which has a main surface, a back surface opposing the main surface, an integrated circuit formed on the main surface, a plurality of first wirings formed over the main surface, the plurality of first wirings being electrically connected to the integrated circuit through a plurality of first through holes, a plurality of first connection terminals formed over the plurality of first wirings, the plurality of first connection terminals being electrically connected to the integrated circuit through the plurality of first through holes and the plurality of first wirings, and a first alignment mark consisting of part of the first wirings; and
a glass substrate which has a main surface, a back surface opposing the main surface, a plurality of second wirings formed over the main surface, a plurality of second connection terminals formed over the first wirings, and a plurality of external connection terminals formed over the back surface, the plurality of second connection terminals being electrically connected to the plurality of external connection terminals through a plurality of second through holes and the plurality of second wirings, a second alignment mark consisting of part of the second wirings, and the second alignment mark overlapping with the first alignment mark in a plane view, wherein
the semiconductor substrate and the glass substrate are arranged so that the main surface of the semiconductor substrate and the main surface of the glass substrate are in face-to-face relation,
the integrated circuit of the semiconductor substrate is electrically connected to the plurality of external connection terminals through the plurality of first connection terminals and the plurality of second connection terminals,
a width of the second wirings is wider than a width of the first wirings,
a diameter of the second through holes is larger than a diameter of the first through holes, and
a sealing resin is filled in the space between the main surface of the semiconductor substrate and the main surface of the glass substrate.

2. A semiconductor integrated circuit device according to claim 1, characterized in that said external connection terminals are a bump electrode, respectively.

3. A semiconductor integrated circuit device according to claim 1, characterized in that said first and second connection terminals, respectively have a diameter that is smaller than a diameter of said external connection terminals.

4. A semiconductor integrated circuit device according to claim 1, characterized in that said first and second connection terminals are larger in number than said external connection terminals.

5. A semiconductor integrated circuit device according to claim 1, characterized in that said first and second connection terminals are a bump electrode, respectively.

6. A semiconductor integrated circuit device according to claim 1, characterized in that said glass substrate is made of no-alkali glass.

7. A semiconductor integrated circuit device according to claim 1, characterized in that said first and second connection terminals are mutually bonded together through Au/Sn eutectic or Au/Au thermo compression bonding.

8. A semiconductor integrated circuit device according to claim 1, characterized in that the part of said integrated circuit formed on the main surface of said semiconductor substrate includes a plurality of active elements.

9. A semiconductor integrated circuit device according to claim 8, characterized in that a passive element is formed on the main surface of said glass substrate.

10. A semiconductor integrated circuit device according to claim 1, characterized in that said integrated circuit includes a plurality of memory cells each constituted of MISFET and a capacitor wherein said MISFET is formed on the main surface of said semiconductor substrate and said capacitor is formed on the main surface of said glass substrate.

11. A semiconductor integrated circuit device according to claim 1, characterized in that said plurality of through-holes are formed by treating said glass substrate by a sand blasting method.

12. A semiconductor integrated circuit device according to claim 1, characterized in that said plurality of through-holes are formed by treating said glass substrate by a sand blasting method and an etching method.

13. A semiconductor integrated circuit device according to claim 1, characterized in that said second connection terminals connected through said multi-layered wirings are connection terminals for signal wiring formed on main surfaces of separate semiconductor chips among said plurality of chips.

14. A semiconductor integrated circuit device according to claim 1, a sealing resin is filled in the space between the main surface of the semiconductor substrate and the main surface of the glass substrate.

15. A semiconductor integrated circuit device according to claim 1, a radiation fin is attached to the back surface of the semiconductor substrate.

* * * * *